(12) United States Patent
Chan et al.

(10) Patent No.: US 10,833,634 B2
(45) Date of Patent: Nov. 10, 2020

(54) DOHERTY POWER AMPLIFIER CIRCUIT

(71) Applicant: City University of Hong Kong, Kowloon (HK)

(72) Inventors: Wingshing Chan, Kowloon (HK); Xinyu Zhou, Kowloon (HK); Shaoyong Zheng, Guangzhou (CN); Xiaohu Fang, Waterloo (CA); Derek Ho, Kowloon (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 15/944,961

(22) Filed: Apr. 4, 2018

(65) Prior Publication Data

US 2019/0312552 A1    Oct. 10, 2019

(51) Int. Cl.
*H03F 1/02*        (2006.01)
*H03F 3/213*       (2006.01)
*H03F 3/195*       (2006.01)
*H03H 7/38*        (2006.01)

(52) U.S. Cl.
CPC .......... *H03F 1/0288* (2013.01); *H03F 3/195* (2013.01); *H03F 3/213* (2013.01); *H03F 2200/255* (2013.01); *H03F 2200/267* (2013.01); *H03F 2200/375* (2013.01); *H03F 2200/387* (2013.01); *H03F 2200/451* (2013.01); *H03H 7/38* (2013.01)

(58) Field of Classification Search
CPC ........ H03F 1/0288; H03F 3/195; H03F 3/213; H03F 2200/267; H03F 2200/387; H03F 2200/375; H03F 2200/255; H03F 2200/451; H03H 7/38

USPC .............................................. 330/124 R, 295
See application file for complete search history.

(56) References Cited

U.S. PATENT DOCUMENTS

| | | | |
|---|---|---|---|
| 5,939,939 A * | 8/1999 | Gaynor | H03F 3/602 330/124 R |
| 9,467,115 B2 | 10/2016 | Lyalin | |
| 9,614,479 B2 | 4/2017 | Hallberg et al. | |
| 9,614,480 B2 | 4/2017 | Maslennikov | |
| 9,667,199 B1 | 5/2017 | McLaren | |
| 9,692,361 B2 | 6/2017 | Blednov | |
| 9,742,365 B1 | 8/2017 | Ozard et al. | |
| 9,787,253 B2 | 10/2017 | Tanimoto et al. | |
| 9,787,262 B2 | 10/2017 | Schenk et al. | |
| 9,800,207 B2 | 10/2017 | Datta et al. | |

(Continued)

*Primary Examiner* — Khanh V Nguyen
*Assistant Examiner* — Khiem D Nguyen
(74) *Attorney, Agent, or Firm* — Renner Kenner Greive Bobak Taylor & Weber

(57) ABSTRACT

A Doherty power amplifier circuit having a main power amplification device, an auxiliary power amplification device arranged in parallel with the main power amplification device, and a load modulation circuit comprising a harmonic injection circuit connected with respective outputs of the main power amplification device and the auxiliary power amplification device. The harmonic injection circuit is arranged to transfer harmonic components generated at the main power amplification device to the auxiliary power amplification device and harmonic components generated at the auxiliary power amplification device to the main power amplification device, when both the main and auxiliary power amplification devices are operating, for modulating the respective outputs of the main power amplification device and the auxiliary power amplification device.

25 Claims, 31 Drawing Sheets

(56) References Cited

U.S. PATENT DOCUMENTS

| | | |
|---|---|---|
| 9,800,209 B2 | 10/2017 | Li |
| 10,224,878 B2 * | 3/2019 | Wang ........................ H03F 1/07 |
| 2004/0108900 A1 * | 6/2004 | Apel ..................... H03F 1/0244 330/285 |
| 2011/0316633 A1 * | 12/2011 | Tadano ................. H03F 1/0272 330/295 |

* cited by examiner

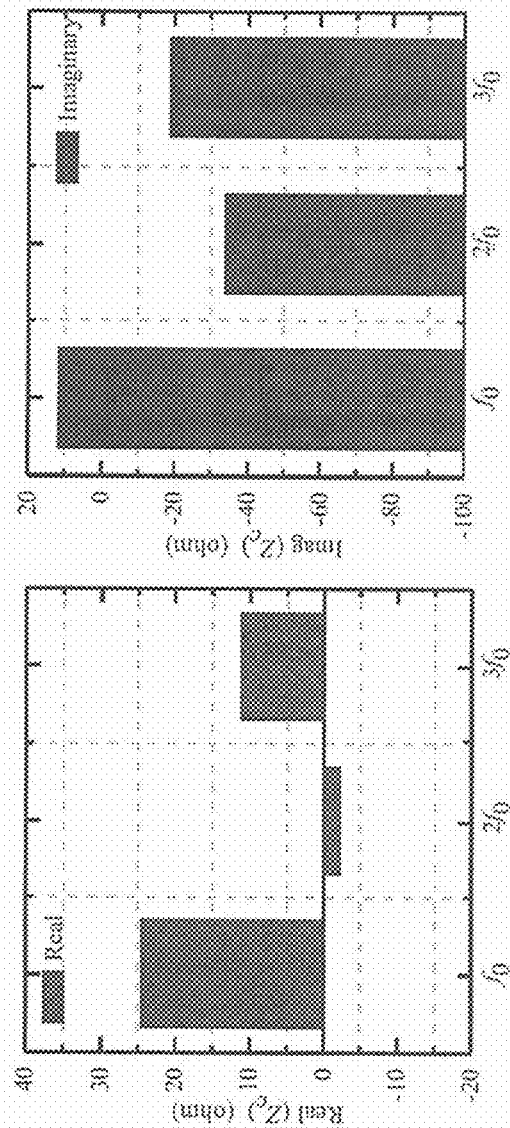
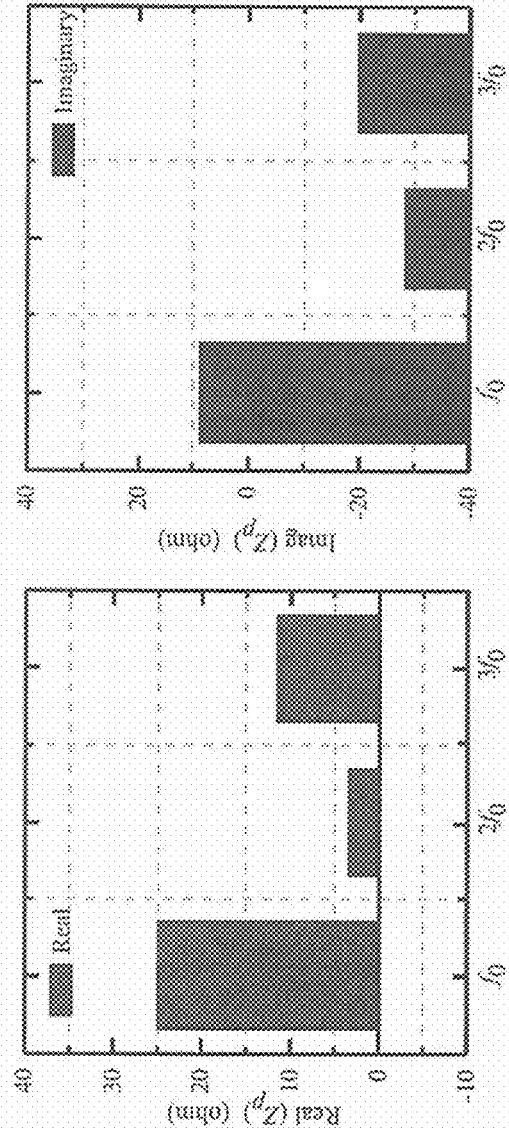
Figure 5A
Figure 5B
Figure 5C
Figure 5D

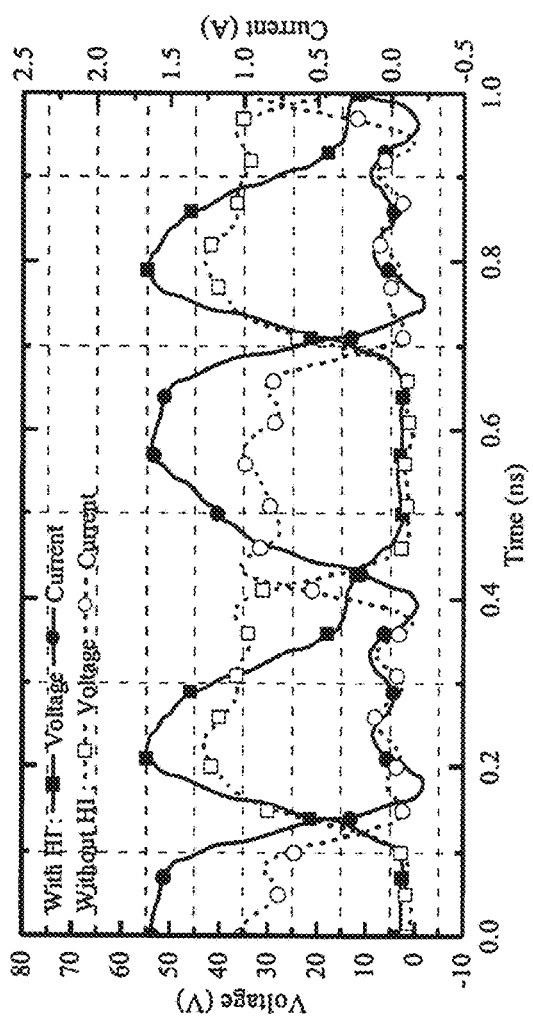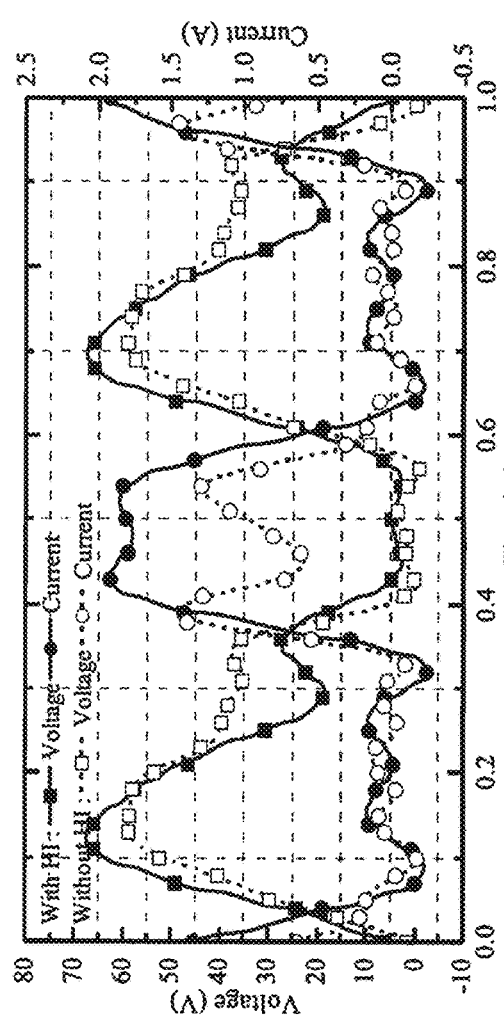

DOHERTY POWER AMPLIFIER CIRCUIT

TECHNICAL FIELD

The invention relates to a Doherty power amplifier circuit and particularly, although not exclusively, a post-matching Doherty power amplifier circuit with extended back-off range based on self-generated harmonic injection.

BACKGROUND

In modern third generation (3G), fourth generation (4G) and future (5G or above) wireless communication systems, the use of modulated signals with high peak to average power ratios (PAPRs) causes a large variation in the instantaneous output power. As a result, power amplifiers (PAs) in base stations of these wireless communication systems are required to maintain high efficiency over a larger dynamic range from extended back-off to saturation. Due to the larger power ratio between the auxiliary power amplification device ("peaking device") and main power amplification device ("carrier device") at saturation, asymmetrical drain biased Doherty power amplifier circuits, with lower drain bias at the main power amplification device, is widely adopted to extend the back-off region. However, this approach is limited by the poor linearity at back-off point.

There is a need to provide a Doherty power amplifier circuit that is compact, has simple structure, is easy to manufacture, and can provide improved efficiency.

SUMMARY OF THE INVENTION

It is an object of the invention to address the above needs, to overcome or substantially ameliorate the above disadvantages or, more generally, to provide an improved Doherty power amplifier circuit, or an improved Doherty power amplifier.

In accordance with a first aspect of the invention, there is provided a Doherty power amplifier circuit, comprising: a main power amplification device; an auxiliary power amplification device arranged in parallel with the main power amplification device; and a load modulation circuit comprising a harmonic injection circuit connected with respective outputs of the main power amplification device and the auxiliary power amplification device, wherein the harmonic injection circuit is arranged to transfer harmonic components generated at the main power amplification device to the auxiliary power amplification device and harmonic components generated at the auxiliary power amplification device to the main power amplification device, when both the main and auxiliary power amplification devices are operating, for modulating the respective outputs of the main power amplification device and the auxiliary power amplification device. The main power amplification device is also known as a "carrier device" and the auxiliary power amplification device is also known as a "peaking device". The harmonic injection circuit preferably has a high pass or band pass frequency response.

Preferably, the Doherty power amplifier circuit is free of additional power amplification device for amplifying harmonic components generated by the main power amplification device and the auxiliary power amplification device.

The harmonic components generated at the main power amplification device may comprise second-harmonic components. In one embodiment, the harmonic components generated at the main power amplification device include only second-harmonic components, without higher order harmonic components. In another embodiment, the harmonic components generated at the main power amplification device include second-harmonic components and other higher-order harmonic components. Preferably, the second harmonic components generated at the main power amplification device only flow into the harmonic injection circuit.

The harmonic components generated at the auxiliary power amplification device may comprise second-harmonic components. In one embodiment, the harmonic components generated at the auxiliary power amplification device include only second-harmonic components, without higher order harmonic components. In another embodiment, the harmonic components generated at the auxiliary power amplification device include second-harmonic components and other higher-order harmonic components. Preferably, the second harmonic components generated at the auxiliary power amplification device only flow into the harmonic injection circuit.

Preferably, the harmonic injection circuit is arranged to provide a 180° phase shift for the second-harmonic components.

Preferably, the harmonic injection circuit comprises: a harmonic extraction circuit for selectively enabling transfer of the harmonic components through the harmonic injection circuit; and an offset transmission line for affecting the phase of the harmonic components during transfer.

Preferably, the harmonic extraction circuit comprises: a first transmission line; a second transmission line arranged in series with the first transmission line; a coupling transmission line arranged between the first and second transmission lines; and a bypass element arranged to selectively enable and disable direct transfer of harmonic components between the first and second transmission lines.

A long axis of the first transmission line and a long axis of the second transmission line may be aligned. The first transmission line and the second transmission line may be of the same length.

Preferably, the first transmission line, second transmission line, coupling transmission line and the offset transmission line form a continuous transmission line.

Optionally, the first transmission line, second transmission line, coupling transmission line and the offset transmission line have the same width.

Preferably, the coupling transmission line is grounded, and more preferably, single-grounded.

Preferably, the coupling transmission line comprises: a first portion arranged to extend perpendicular to the first transmission line; a second portion arranged to extend perpendicular to the second transmission line; and a third portion arranged to connect the first and second portions. The first portion may be parallel to (in terms of the extension direction) the second portion. The third portion may be grounded.

Preferably, the bypass element comprises a capacitor. Preferably, the bypass element is a capacitor. Alternatively, the bypass element may be other electronic components arranged or connected to provide a high-pass function.

Preferably, the offset transmission line is arranged to introduce a 180° phase shift, in particular a 180° injection phase shift, for the second-harmonic components.

Preferably, the load modulation circuit further comprises: a first fundamental impedance inverter with an input connected with the output of the main power amplification device and the harmonic injection circuit, and an output; a second fundamental impedance inverter with an input connected with the auxiliary of the main power amplification device and the harmonic injection circuit, and an output; and an offset transmission line connected between the output of the first fundamental impedance inverter and the output of the second fundamental impedance inverter, the offset transmission line is arranged to compensate for the phase difference between the fundamental components generated at the main power amplification device and the fundamental components generated at the auxiliary power amplification device. The first and second fundamental impedance inverters may each form an LC-tank-equivalent circuit.

Preferably, the Doherty power amplifier circuit is an asymmetrically Doherty power amplifier circuit in which the auxiliary power amplification device has a higher power capability than the main power amplification device. Alternatively, the Doherty power amplifier circuit can be a symmetric Doherty power amplifier circuit, or an N-way Doherty power amplifier circuit.

Preferably, the main power amplification device comprises a transistor biased to operate in Class AB mode; the auxiliary power amplification device comprises a transistor biased to operate in Class C mode. However, the main power amplification device and auxiliary power amplification device can be of any type and for different power applications.

The Doherty power amplifier circuit may be particularly adapted for operation in WCDMA systems.

In accordance with a second aspect of the invention, there is provided an electronic device comprising the Doherty power amplifier circuit of the first aspect. The electronic device may be, for example, a communication device, in particular a wireless communication device. For example, the communication device can be a mobile phone, tablet, smart watch, IoT devices with communication function, etc.

In accordance with a third aspect of the invention, there is provided an electronic system comprising the Doherty power amplifier circuit of the first aspect. The electronic system may be, for example, a communication system, in particular a wireless communication system. The electronic system can include a base station for wireless communication.

BRIEF DESCRIPTION OF THE DRAWINGS

Embodiments of the invention will now be described, by way of example, with reference to the accompanying drawings in which:

FIG. 5A is a graph showing the real part of simulated drain impedances at center frequency $f_0$ when the main power amplification device ("carrier device") of FIG. 2 is at fundamental ($f_0$), second ($2f_0$), and third harmonic ($3f_0$) at saturation;

FIG. 5B is a graph showing the imaginary part of simulated drain impedances at center frequency $f_0$ when the main power amplification device ("carrier device") of FIG. 2 is at fundamental ($f_0$), second ($2f_0$), and third harmonic ($3f_0$) at saturation;

FIG. 5C is a graph showing the real part of simulated drain impedances at center frequency $f_0$ when the auxiliary power amplification device ("peaking device") of FIG. 2 is at fundamental ($f_0$), second ($2f_0$), and third harmonic ($3f_0$) at saturation;

FIG. 5D is a graph showing the imaginary part of simulated drain impedances at center frequency $f_0$ when the auxiliary power amplification device ("peaking device") of FIG. 2 is at fundamental ($f_0$), second ($2f_0$), and third harmonic ($3f_0$) at saturation;

FIG. 22A is a graph showing the de-embedding drain waveform of carrier device at saturation, obtained from the DPA of FIG. 17 using the device of FIG. 21, for the cases with harmonic injection and without harmonic injection;

FIG. 22B is a graph showing the de-embedding drain waveform of peaking device at saturation, obtained from the DPA of FIG. 17 using the device of FIG. 21, for the cases with harmonic injection and without harmonic injection;

DETAILED DESCRIPTION

Figure 1:
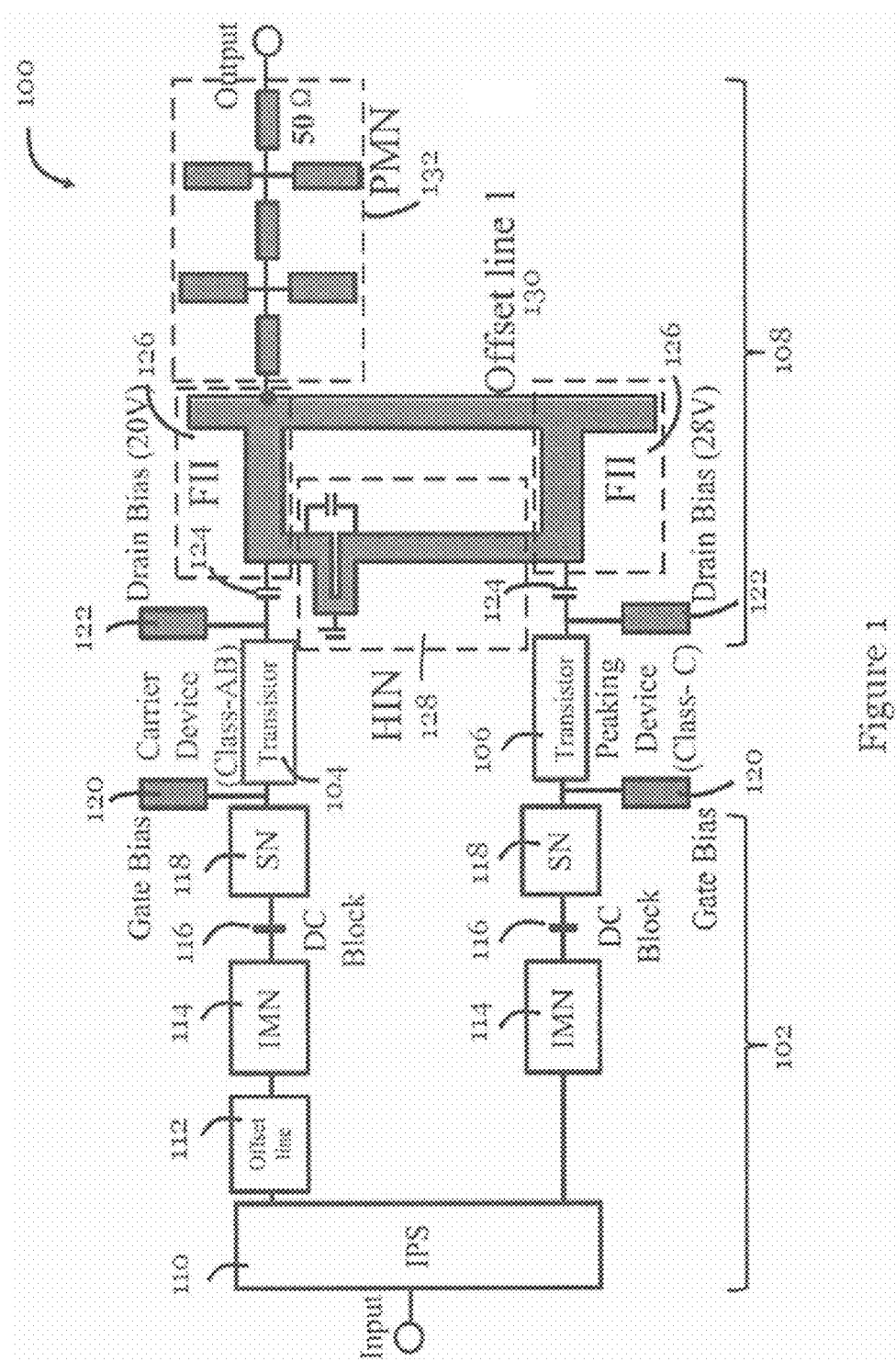
FIG. 1 is a high-level circuit diagram of the Doherty power amplifier (DPA) in one embodiment of the invention.

The inventors of the invention have devised, through research and trials, that traditional Doherty power amplifier (DPA) consists of two identical active devices with symmetric biasing to achieve the required profiles of load modulation, and it can provide high efficiency from 6-dB output back-off power to saturation. However, the more efficient digital modulation schemes with even higher peak to average power ratios (PAPRs) have been adopted in modern and future wireless communication systems. For example, wideband code-division multiple access (WCDMA) has a PAPR of 9.6 dB. Power amplifiers (PAs) in base stations are therefore required to maintain high efficiency over a larger dynamic range from extended back off to saturation.

M. Iwamoto, A. Williams, P.-F. Chen, A. G. Metzger, L. E. Larson, and P. M. Asbeck, "*An extended Doherty amplifier with high efficiency over a wide power range,*" *IEEE Trans. Microw. Theory Techn.*, vol. 49, no. 12, pp. 2472-2479, December 2001 and X. H. Fang and K-K M. Cheng, "*Extension of high-efficiency range of Doherty amplifier by using complex combining load,*" *IEEE Trans. Microw. Theory Techn.*, vol. 62, no. 9, pp. 2038-2047, September 2014 have provided the analysis of the principle behind the extended back off for Doherty topology.

The inventors of the invention have also devised, through research and trials, that in general, the output back off (OBO) in decibel can be expressed as $$OBO(dB) = 10 \log[(1+\alpha)\beta_d] \quad (1)$$

$$\alpha = P_{sat,p}/P_{sat,c} \quad (2)$$

$$\beta_d = P_{sat,c}/P_{back-off,c} \quad (3)$$

where $P_{sat,c}$ and $P_{sat,p}$ refer to the saturated carrier and peaking fundamental power and $P_{back-off,c}$ is the back-off carrier fundamental power.

Also, in conventional DPAs, the value of $\alpha$ and $\beta_d$ can be theoretically expressed as $$\beta_d = 1 + \alpha \quad (4)$$

And the OBO range can be further expressed as $$OBO(dB) = 10 \log[(1+\alpha)^2] \quad (5)$$

The inventors of the invention have accordingly realized that the back-off range is solely determined by the saturated power ratio between two transistors and consequently a higher OBO necessitate the underutilization of the carrier device (e.g., reduced drain bias). However, with the decrease of carrier drain bias which is used for a wider back-off range, the carrier device will suffer from being over-driven at back off, which results in the deterioration of gain compression. Considering that the DPA is widely recognized as a linear PA, meaningful back-off extension should be achieved with a good balance between efficiency and linearity. Clearly, the conventional DPA, in particular asymmetrical drain biased DPA, has limitations.

The inventors of the invention have also devised, through research, experiments, and trials, that there are two major targets that needs to be met if further back-off extension of asymmetrical drain biased DPA is to be achieved:

1) The value of $\beta_d$ should be controlled independently, which can be achieved with higher $P_{sat,c}$ while maintaining $P_{back-off,c}$.

2) The value of $\alpha$ in asymmetrical DPA (ADPA) should be maintained, as the enhancement of $P_{sat,c}$ in the first target, a higher $P_{sat,p}$ is required to stop a reducing.

FIG. 1 shows a Doherty power amplifier (DPA) 100 in one embodiment of the invention. In this embodiment, the DPA 100 has an asymmetrical drain biased configuration. The DPA 100 in general includes an input side network 102, a main power amplification device 104 ("carrier device") connected with a biasing network, an auxiliary power amplification device 106 ("peaking device") connected with a biasing network, and an output side circuit 108 including a load modulation network (LMN) and a post-matching network (PMN).

The input side network 102 includes an input power splitter (IPS) no connected at the input of the DPA 100, and two parallel branches connected with the output of the IPS. In the first (upper) branch, there is an offset line 112, an input matching network (IMN) 114, a DC block 116, and a stabilization network (SN) 118. The second (lower) branch has an input matching network (IMN) 114, a DC block 116, and a stabilization network (SN) 118.

The carrier device 104, including a power transistor, is connected in the first branch. In this example, the carrier device 104 is biased to operate in Class AB mode. A biasing network with a gate bias 120 and a drain bias 122 is connected at two ends of the carrier device 104. The drain bias 122 in this example is 20V. A capacitor 124 is arranged at the output of the carrier device 104. The peaking device 106, including a power transistor, is connected in the second branch. In this example, the peaking device 106 is biased to operate in Class C mode. A biasing network with a gate bias 120 and a drain bias 122 is connected at two ends of the peaking device 106. The drain bias 122 in this example is 28V. A capacitor 124 is arranged at the output of the peaking device 106. The asymmetrical drain biased carrier device 104 (at 20 V) and peaking device 106 (at 28 V) can be considered as two current sources in phase quadrature. Hence, the peaking device 106 behaves as a voltage controlled current source providing the current to modulate the load impedance of the carrier device 104 for Doherty behavior.

The load modulation network of the output side circuit 108 includes, in general, a fundamental impedance inverter (FII) 126 connected to the output of the carrier device 104, a FII 126 connected to the output of the peaking device 106, a harmonic input network (HIN) 128 connected across the two fundamental impedance inverters near the outputs of the carrier and peaking devices 104, 106. An offset line ("offset line 1") 130 is connected across the two fundamental impedance inverters, further away from the carrier and peaking devices 104, 106 than the HIN 128.

The post-matching network (PMN) 132 is arranged between the load modulation network and the output of the DPA 100, to which a load may be connected.

Figure 2:
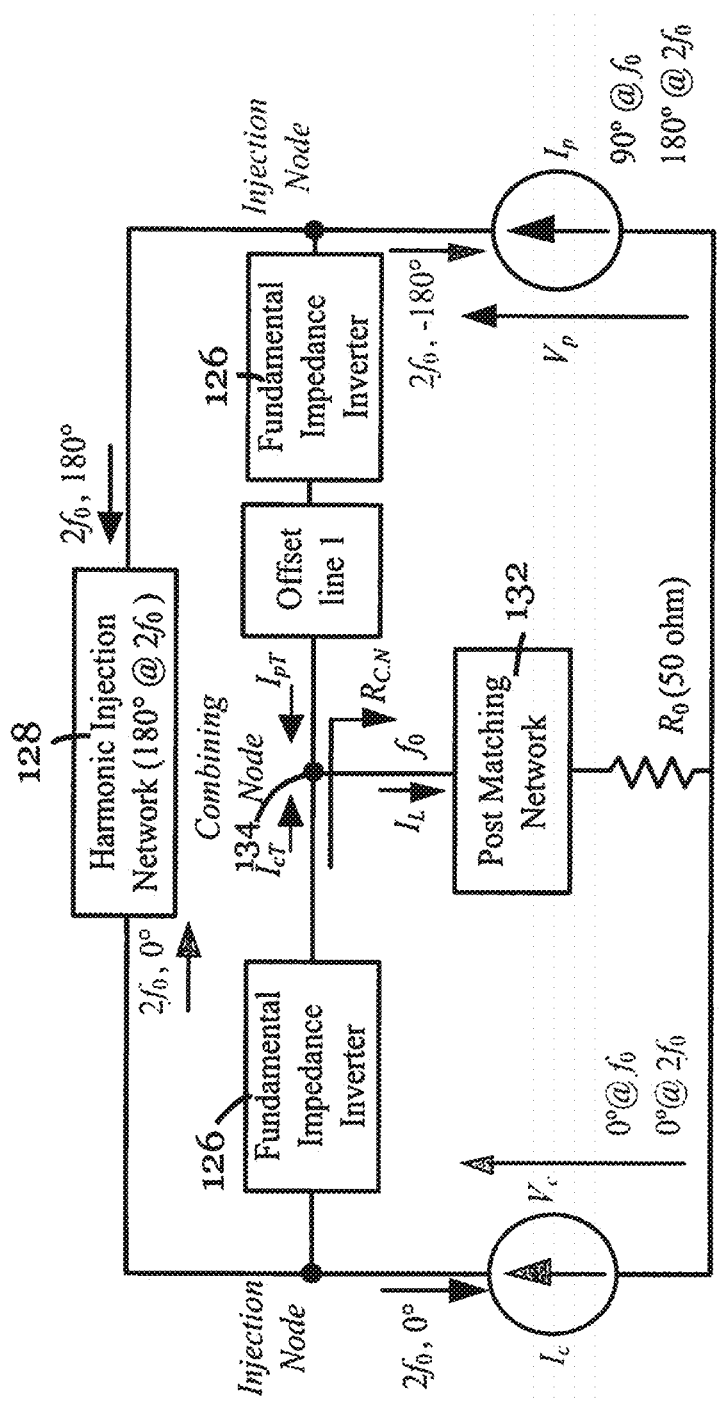
FIG. 2 is a functional block diagram of the DPA of FIG. 1, without the input side circuit, in one embodiment of the invention.

FIG. 2 shows the functional block diagram of the output side circuit of FIG. 1. As shown in FIG. 2, the paths for the two fundamental signals are combined at the combining node 134 between the FII 126 of the carrier device 104 and the PMN 132. This combined signal is transferred to the load (in this example, 50Ω) through the PMN 132, while the second-harmonic components of carrier device 104 and peaking device 106 are both injected into the drain of each other through the HIN (180°) 128, when the carrier device 104 and peaking device 106 are operating.

Figure 3:
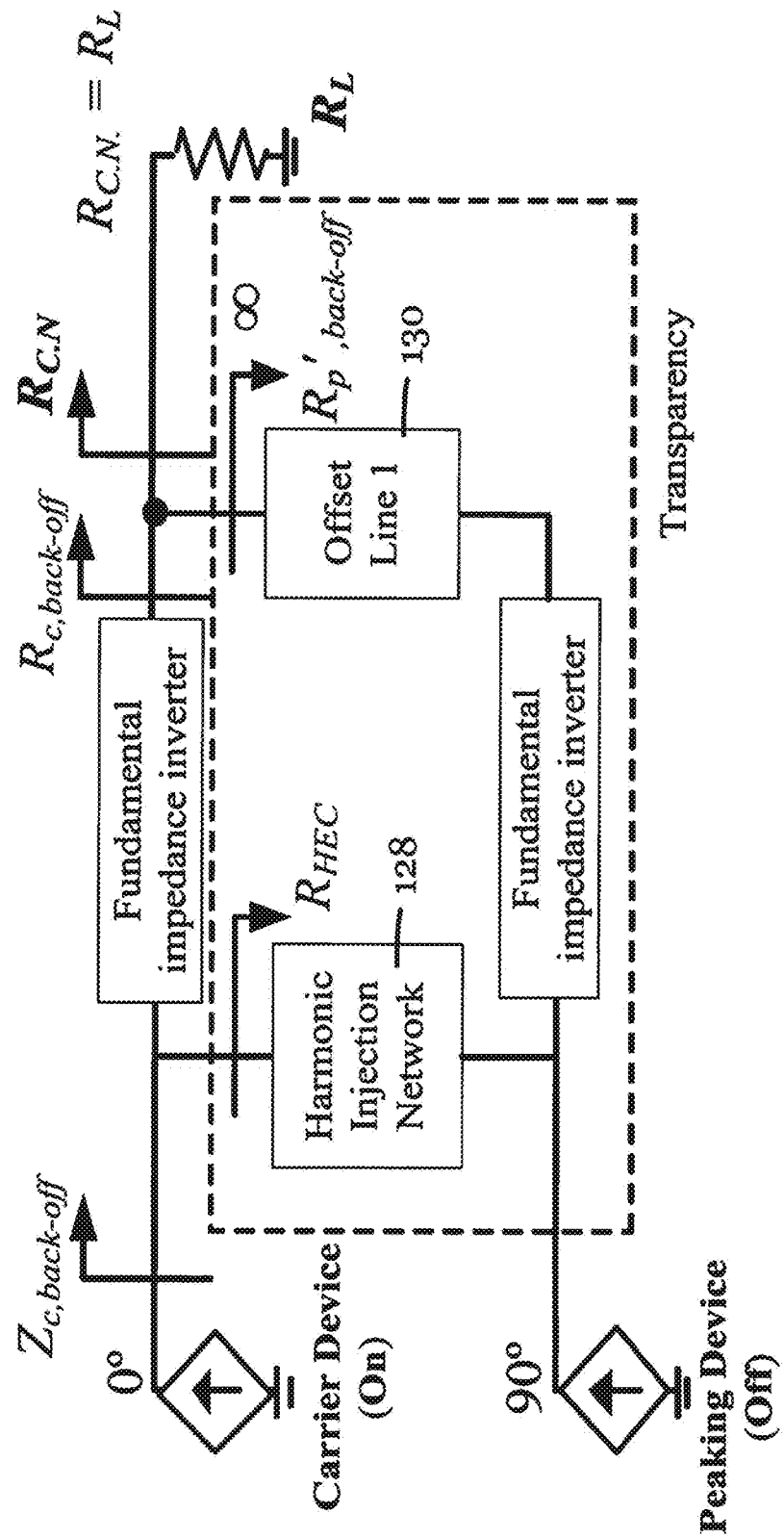
FIG. 3 is functional block diagram of the DPA of FIG. 2 during operation in back-off region.
Figure 4:
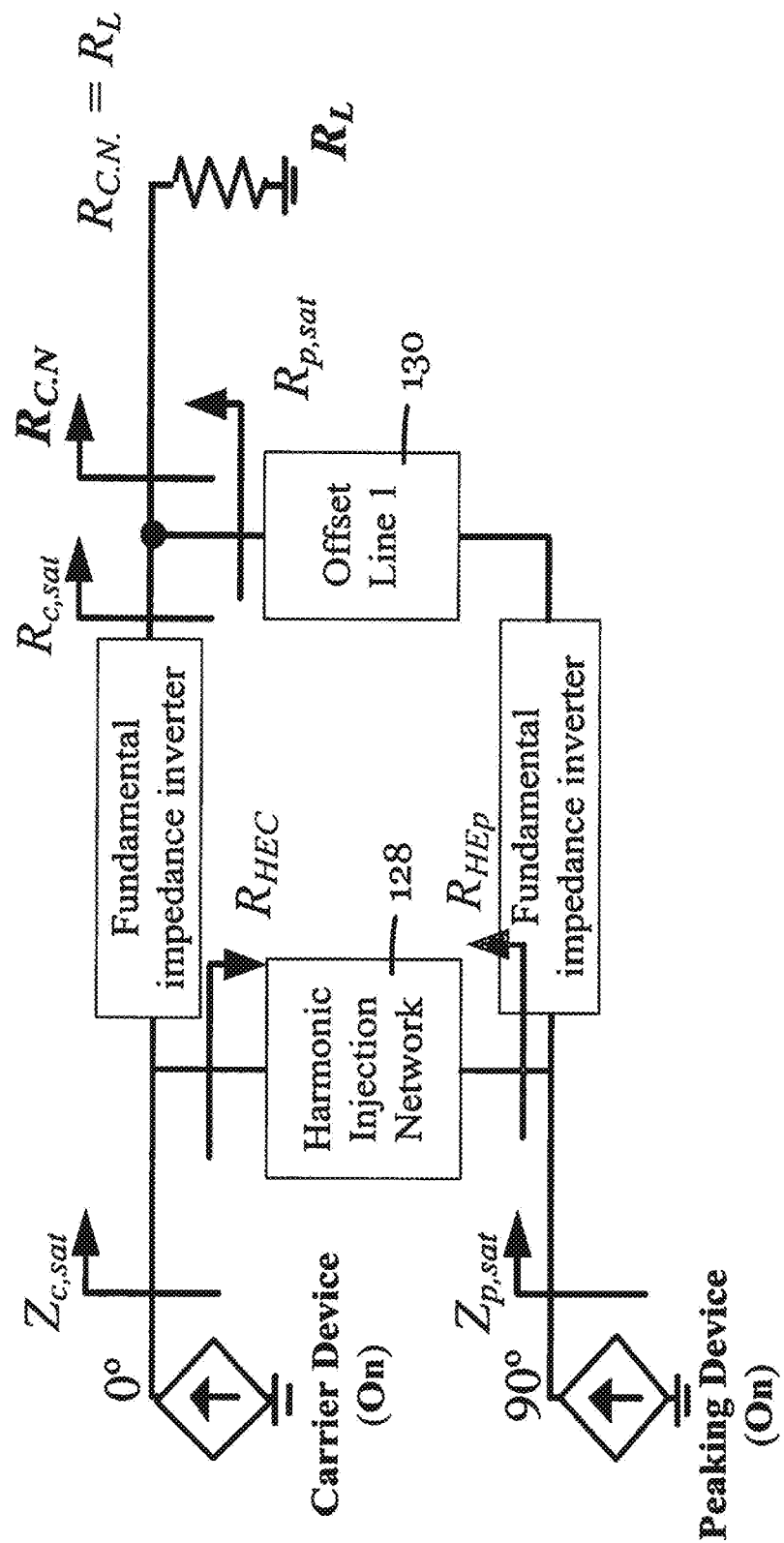
FIG. 4 is functional block diagram of the DPA of FIG. 2 during operation at saturation.

Operations of the asymmetrical drain biased DPA 100 of FIG. 1 are different at back-off point and at saturation. FIGS. 3 and 4 illustrate the operation of the DPA 100 of FIG. 1 at back-off (FIG. 3) and at saturation (FIG. 4) respectively. In FIG. 3, $R_{c,back\text{-}off}$ refers to the output impedance of carrier branch at back-off point. $R'_{p,back\text{-}off}$ refers to the output impedance toward the peaking branch at back-off point. $Z_{c,back\text{-}off}$ represents the drain impedance seen by the carrier device 104 at back-off point. $R_{HEC}$ refers to impedance toward the peaking branch at harmonic extracting point. In FIG. 4, $R_{c,sat}$ and $R_{p,sat}$ refer to the output impedance of carrier and peaking branch at saturation, respectively. $Z_{c,sat}$ and $Z_{p,sat}$ represent the drain impedance seen by the carrier device 104 and peaking device 106 at saturation, respectively, while $R_{HEp}$ refers to the impedance seen toward the carrier branch at the harmonic extracting point. $R_{C.N.}$ refers to the impedance at the signal combining point. Collectively, this is the overall load impedance of the load modulation network.

Before the back-off point, only the carrier device 104 is conducting with a resistive load impedance of $R_L$ at $R_{c,back\text{-}off}$. With the high fundamental-impedance characteristic of HIN 128 and offset line 1 130 in the load modulation network, the peaking branch and HIN 128 appears as an open circuit to the carrier branch. The values of $R_{C.N.}$ and $R_{c,back\text{-}off}$ are effectively the same. The load conditions are as follows:

$$R_{c,back\text{-}off} \text{ at } f_0 = R_L \quad (6)$$

$$R'_{p,back\text{-}off} \text{ at } f_0 = R_{HEC} \text{ at } f_0 = \infty \quad (7)$$

$$R_{C.N.} \text{ at } f_0 = R_L \quad (8)$$

On the other hand, at saturation, both carrier device 104 and peaking device 106 are conducting. Offset line 1 130 compensates for the phase difference between the two fundamental signals. In this region at the fundamental frequency, $R_{C.N.}$ should remain the same as $R_L$. Correspondingly, $R_{c,sat}$ at $f_0$ is $(1+\alpha)$ times that of $R_L$. Also, $R_{p,sat}$ at $f_0$ should be equal to $(1+1/\alpha)$ times $R_L$. Moreover, $R_{HEp}$ should be infinite to prevent the peaking fundamental signal leaking into the HIN 128 and the carrier branch. The ideal load conditions are as follows:

$$R_{c,sat} \text{ at } f_0 = (1+\alpha) R_L \quad (9)$$

$$R_{p,sat} \text{ at } f_0 = (1+1/\alpha) \quad (10)$$

$$R_{HEp} \text{ at } f_0 = \infty \quad (11)$$

$$R_{C.N.} \text{ at } f_0 = R_L \quad (12)$$

The operation of the harmonic injection network will be described in further detail now. When the carrier device 104 and peaking device 106 reach saturation, both devices generate large second-harmonic components, which are used to advantage as no additional components are necessary. To achieve this, an HIN 128 is integrated into the post-matching Doherty topology, as illustrated in FIG. 1. In this example, the best performance for output power and efficiency can be obtained when the phase of HIN 128 is 180° at $2f_0$. B designing and arranging the HIN 128 to match the impedance characteristics with the output impedances of the carrier device 104 and peaking device 106 at second harmonic, the second harmonic components of the carrier device 104 and peaking device 106 only flow into the HIN 128 (i.e., do not leak further downstream).

The second-harmonic component generated by the peaking device (180°) is injected into the drain of carrier device 104 through the HIN 128 with 0°. The carrier drain waveforms with injected second harmonic from the peaking device 106 can be written as $$\begin{aligned} v_D(\omega t) &= V_{DD} + v_{1c}\cos(\omega t) + v_{2c}\cos(2\omega t) + a_{inj\_p}\cos(2\omega t) \\ &= V_{DD} + v_{1c}\cos(\omega t) + (v_{2c} + a_{inj\_p})\cos(2\omega t) \end{aligned} \quad (13)$$

$$\begin{aligned} i_D(\omega t) &= I_{DD} - i_{1c}\cos(\omega t) - i_{2c}\cos(2\omega t) + b_{inj\_p}\cos(2\omega t) \\ &= I_{DD} - i_{1c}\cos(\omega t) + (b_{inj\_p} - i_{2c})\cos(2\omega t) \end{aligned} \quad (14)$$

where $V_{DD}$ and $I_{DD}$ are the dc components of time-domain signals, $v_{nc}$ and $i_{nc}$ (n=1, 2) are the voltage and current components of the fundamental, second harmonics of the carrier device 104, and $a_{inj\_p}$ and $b_{inj\_p}$ are the amplitudes of the voltage and current of the injected second-harmonic component from the peaking device 106, respectively.

In terms of voltage waveform, the peak amplitude can be obtained when $\omega t=0$, which is $v_{1c}+v_{2c}+a_{inj\_p}$, which achieves an increase in amplitude for the voltage peak. While for the current waveform, due to the presence of self-generated second-harmonic current of the carrier device 104, the current waveform in amplitude is $i_{1c}-i_{2c}$. When the peaking second harmonic current component ($b_{inj\_p}$) is injected, the peak current amplitude is modulated to ($i_{1c}-i_{2c}+b_{inj\_p}$), which results in a higher value. Enhancements can be seen in the carrier saturated amplitude of both voltage and current. The carrier saturated output power ($P_{sat,c}$) can be expressed as $$P_{sat,c} = \frac{1}{2} \times [(v_{1c}+v_{2c}+a_{inj\_p})(i_{1c}-i_{2c}+b_{inj\_p})] \quad (15)$$

More importantly, there are nearly no second-harmonic components which can be provided to the carrier device 104 at the back-off point because the peaking device 106 is just at "turn ON." Hence, the back-off voltage is $v_{1c}+v_{2c}$ due to the voltage saturation characteristic of DPA, and the back-off current is $1/(1+\alpha)$ times $i_{1c}-i_{2c}$ because of the load condition mentioned in equation (10). Hence, $P_{back-off,c}$ remains unchanged from the original ADPA $$P_{back-off,c} = \frac{1}{2} \times [(v_{1c}+v_{2c})((i_{1c}-i_{2c})/(1+\alpha))] \quad (16)$$

By dividing equation (15) by equation (16), $\beta_d$ can be calculated as $$\beta_d = \left(1 + \frac{a_{inj\_p}}{v_{1c}+v_{2c}}\right)\left(1 + \frac{b_{inj\_p}}{i_{1c}-i_{2c}}\right)(1+a) \quad (17)$$

It can be observed from the above that the value in the first bracket is always larger than 1. Similarly, $i_{1c}$ larger than $i_{2c}$ in the carrier amplifier, and hence, the second bracket is also greater than 1. Compared with $\beta_d=1+\alpha$ of the asymmetrical drain biased DPA without harmonic injection, the $\beta_d$ of DPA of the present embodiment is enhanced by the injected peaking second-harmonic components. Namely, the first target (that $\beta_d$ should be controlled independently) can be satisfied by the harmonic injection concept in the present embodiment.

While for the second-harmonic component generated by the carrier device (0°) 104, it is injected into the drain of the peaking device through HIN 128. The peaking drain waveforms with second-harmonic injection from the carrier device 104 can be expressed as $$v_D(\omega t + 90°) = V_{DD} + v_{1p}\cos(\omega t + 90°) + \quad (18)$$
$$v_{2p}\cos(2(\omega t + 90°)) + a_{inj\_c}\cos(2\omega t - 180°) =$$
$$V_{DD} + v_{1p}\cos(\omega t + 90°) + (v_{2p} + a_{inj\_c})\cos(2(\omega t + 90°))$$

$$i_D(\omega t + 90°) = I_{DD} - i_{1p}\cos(\omega t + 90°) - \quad (19)$$
$$i_{2p}\cos(2(\omega t + 90°)) + b_{inj\_c}\cos(2\omega t - 180°) =$$
$$I_{DD} - i_{1p}\cos(\omega t + 90°) + (b_{inj\_c} - i_{2p})\cos(2(\omega t + 90°))$$

where $V_{DD}$ and $I_{DD}$ are the dc components of time-domain signals, $v_{np}$ and $i_{np}$ (n=1, 2) are the voltage and current amplitudes of fundamental, second harmonics of peaking device, and $a_{inj\_c}$ and $b_{inj\_c}$ are the amplitudes of the voltage and current of the injected second-harmonic component from carrier device 104, respectively.

Similarly, for the carrier device 104, the enhanced $P_{sat,p}$ can be written as $$P_{sat,p} = \frac{1}{2} * [(v_{1p}+v_{2p}+a_{inj\_c})(i_{1p}-i_{2p}+b_{inj\_c})] \quad (20)$$

By dividing equation (20) by equation (15), $\alpha$ can be calculated as $$\alpha = \frac{(v_{1p}+v_{2p}+a_{inj\_c})(i_{1p}-i_{2p}+b_{inj\_c})}{(v_{1c}+v_{2c}+a_{inj\_p})(i_{1c}-i_{2c}+b_{inj\_p})} \quad (21)$$

$$= \left(\frac{v_{1p}+v_{2p}+a_{inj\_c}}{v_{1c}+v_{2c}+a_{inj\_p}}\right)\left(\frac{i_{1p}-i_{2p}+b_{inj\_c}}{i_{1c}-i_{2c}+b_{inj\_p}}\right).$$

Considering that the value of $a_{inj\_c}$ and $a_{inj\_p}$ are relatively small compared with $(v_{1p}+v_{2p})$ and $(v_{1c}+v_{2c})$, the first bracket has small variations in value no matter what the injected power are. Similarly, the value of $b_{inj\_c}$ and $b_{inj\_p}$ are also relatively small compared with $(i_{1p}-i_{2p})$ and $(i_{1c}-i_{2c})$, and so the second bracket has no significant impact on the value with or without injected power. Hence, $\alpha$ of the ADPA of the present embodiment is not influenced by both harmonic injection. This achieves the second target (that a in ADPA is maintained).

In M. D. Roberg, "*Analysis and design of non-linear amplifiers for efficient microwave transmitters,*" Ph.D. dissertation, Dept. Elect. Eng., Colorado Univ., Denver, Colo., USA, 2012, the electrical-impedance synthesis for arbitrary impedance, by controlling the relative power and phase between two excitation sources was demonstrated. When the relative phase is 180° and the injected power is larger than the source power, the negative real part of input impedance can be obtained and vice versa.

According to equations (13), (14), (18), and (19), the sign of $Z_c$ at $2f_0$ and $Z_p$ at $2f_0$ depend on the value of injected current component ($b_{inj\_p}$ and $b_{inj\_c}$) and self-generated current component ($i_{2c}$ and $i_{2p}$). Due to the use of asymmetric drain biasing, the $2f_0$ power of peaking device 106 is larger than that of the carrier device 104. Correspondingly, $b_{inj\_p} > i_{2c}$ and $b_{inj\_c} < i_{2p}$. Therefore, the negative real part of $Z_c$ at $2f_0$ can be achieved, which leads to better offset between carrier drain voltage and current waveform. On the other side, the positive sign of $Z_p$ at $2f_0$ can also be obtained. The corresponding drain-impedance conditions can be expressed as $$\text{Real part of } Z_c \text{ at } 2f_0 < 0, b_{inj\_p} > i_{2c} \quad (22)$$

$$\text{Real part of } Z_p \text{ at } 2f_0 > 0, b_{inj\_c} < i_{2p} \quad (23)$$

Figure 14:
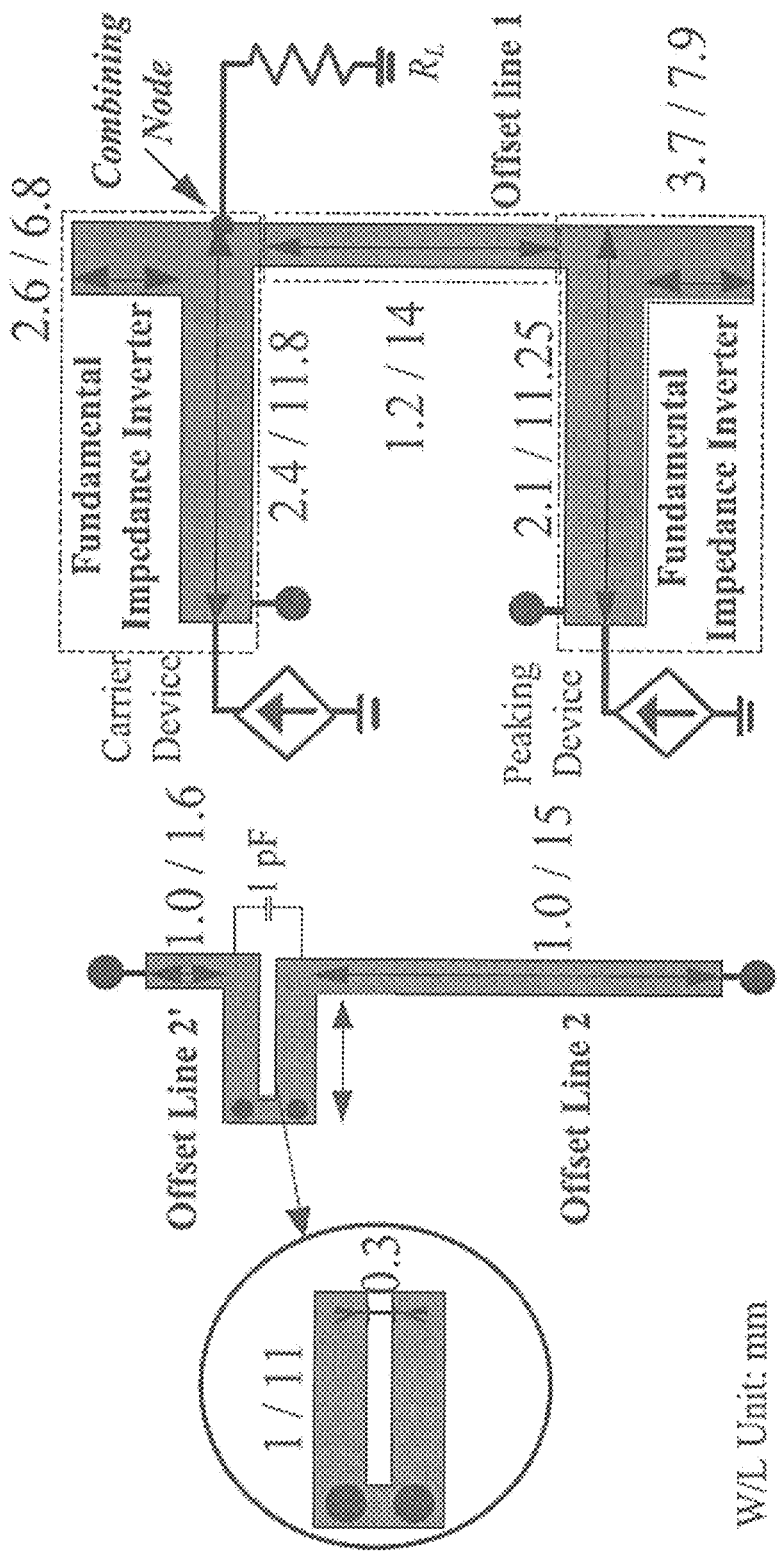
FIG. 14 is a schematic diagram illustrating the load modulation network (including the harmonic injection circuit, 2 fundamental impedance inverters, and offset transmission line) of the DPA of FIG. 1 and its dimensions in one embodiment of the invention.
Figure 15:
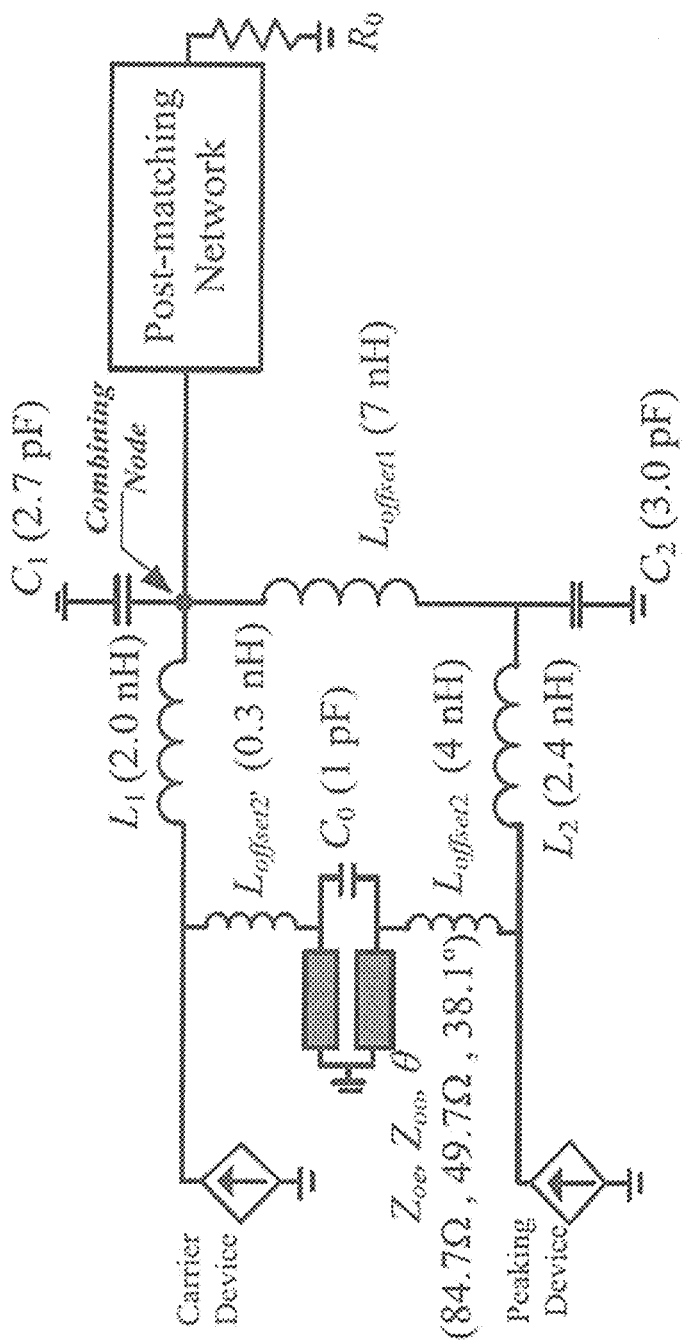
FIG. 15 is a circuit diagram illustrating the equivalent circuit of the load modulation network of FIG. 14 and a post-matching network in one embodiment of the invention.
Figure 16:
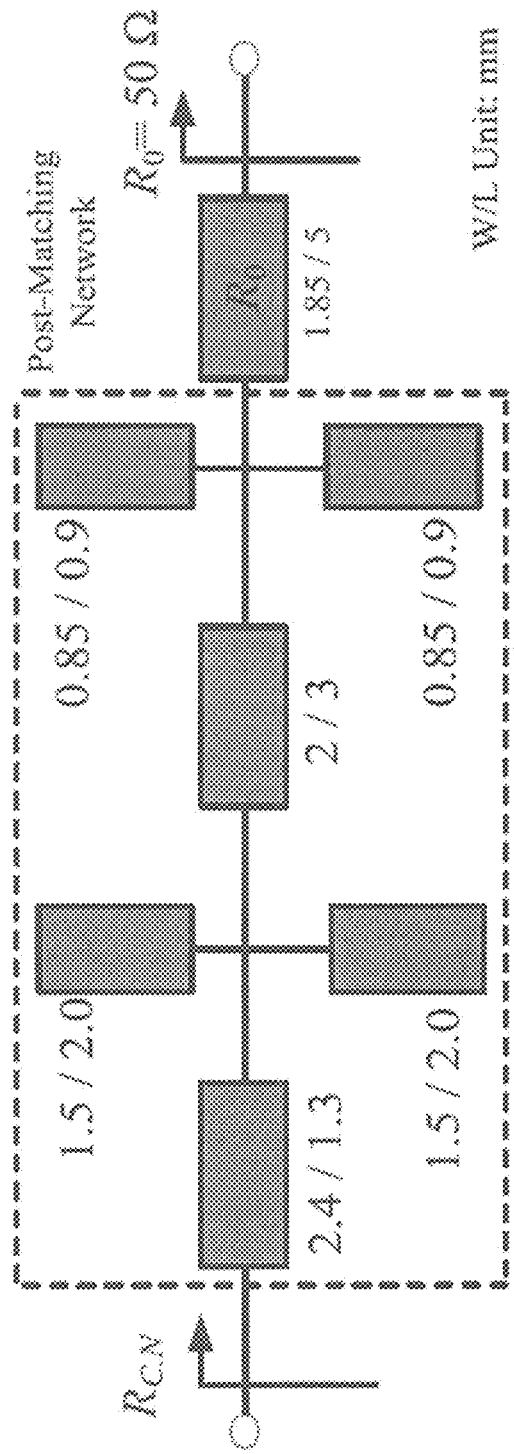
FIG. 16 is a schematic diagram illustrating the post-matching network in the DPA of FIG. 1 and its dimensions in one embodiment of the invention.

FIGS. 5A to 5D show the simulated saturated drain impedance at center frequency for carrier device 104 and peaking device 106 at $f_0$, $2f_0$, and $3f_0$, for real and imaginary parts based on circuit dimensions given in FIGS. 14 to 16. The carrier second-harmonic drain impedance has a negative real part, whereas the peaking second-harmonic drain impedance has a positive part.

Figure 6:
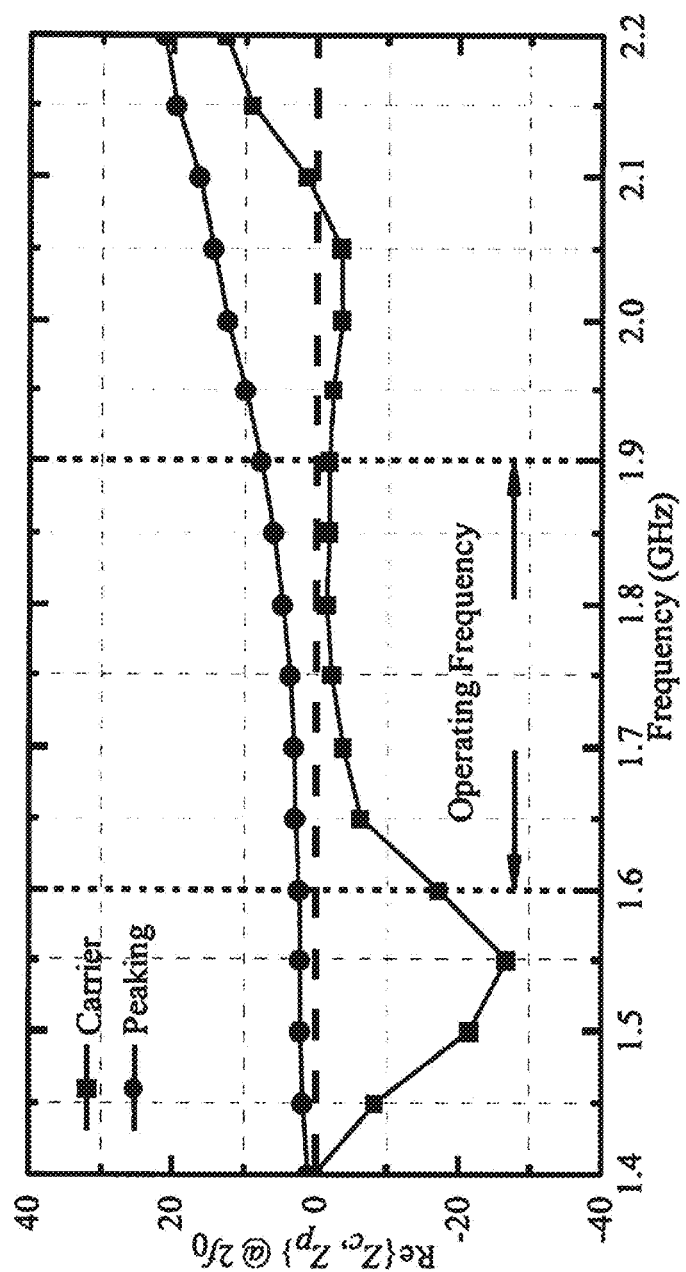
FIG. 6 is a graph showing simulated real part of second-harmonic drain impedance of the carrier device and of the peaking device of FIG. 2 at different frequencies.

To further demonstrate the effect of second-harmonic injection, the simulated real part of $Z_c$ at $2f_0$ and $Z_p$ at $2f_0$ versus frequency is shown in FIG. 6. The real part of carrier device 104 is negative, whereas the real part of the peaking device 106 is positive over the entire operating frequency range.

Figure 7:
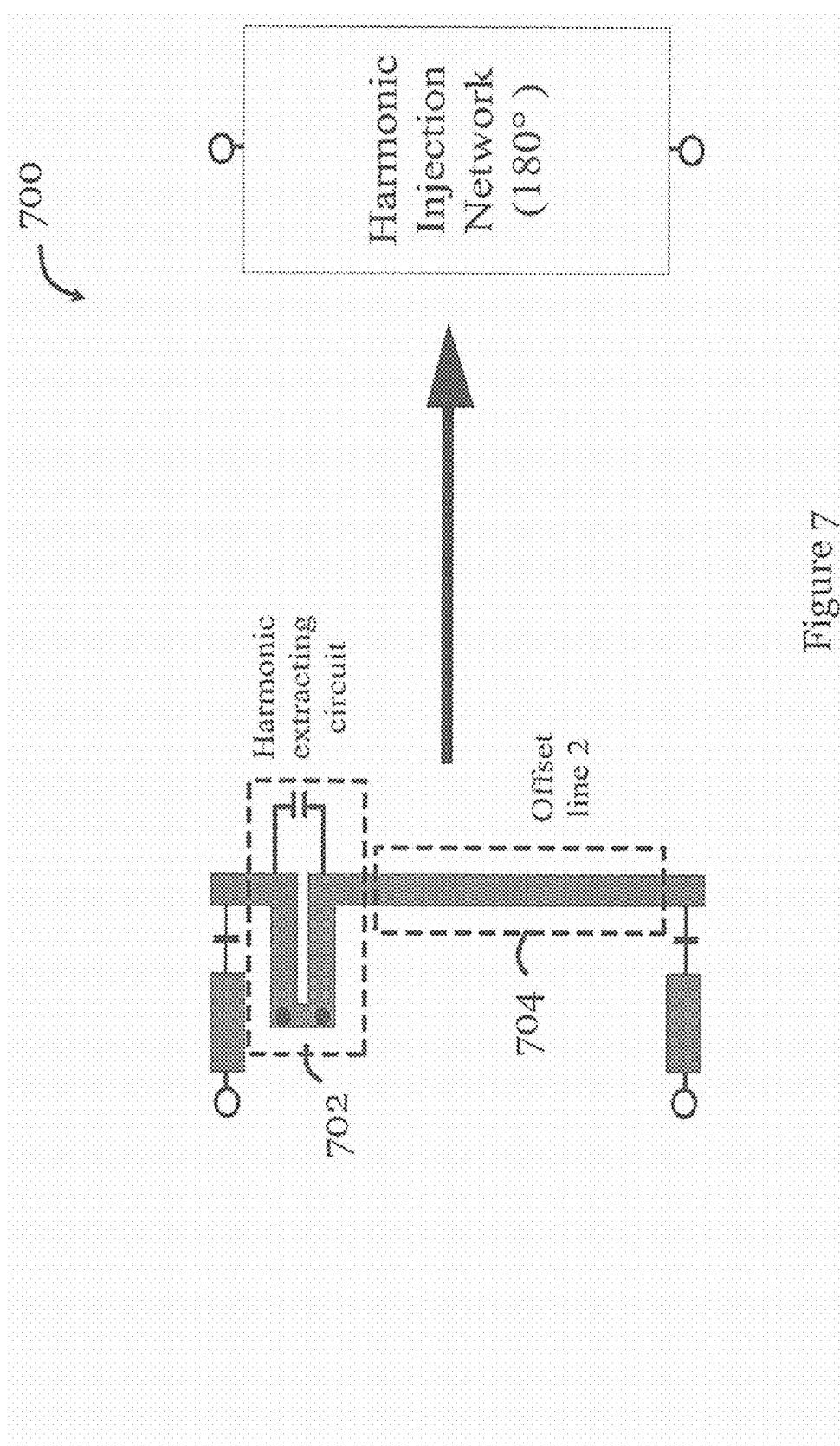
FIG. 7 is a schematic diagram of the harmonic injection circuit in the DPA of FIG. 1.

FIG. 7 shows the harmonic injection network (HIN) 700 of the DPA 100 of FIG. 1 in one embodiment of the invention. The HIN 700 includes a harmonic extracting circuit (HEC) 702 and a second-harmonic injection offset line ("offset line 2") 704.

Figure 8:
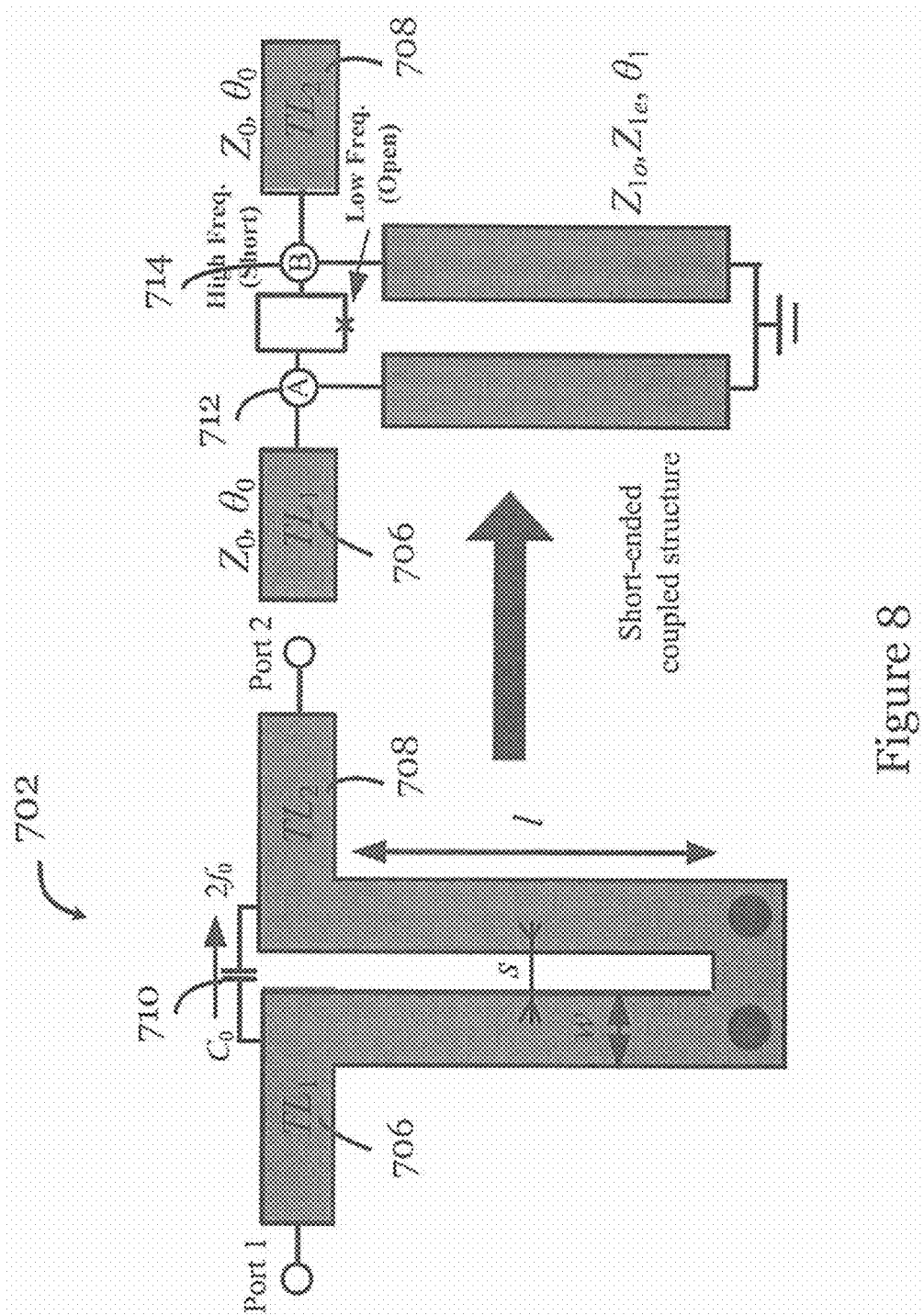
FIG. 8 is a schematic diagram of the harmonic injection circuit of FIG. 7 for operation with low frequency signal and high frequency signal.

FIG. 8 illustrates the geometry and operating principle of the HEC 702 for low and high frequencies in one embodiment of the invention. As shown in FIG. 7, the HEC 702 includes two transmission lines (TL$_1$ 706 and TL$_2$ 708) connected by a coupling line shorted to ground. A bypass element 710, in the form of a capacitor ($C_0$) in this embodiment, is connected directly between the first 706 and second 708 transmission lines. The bypass element 710 is arranged in parallel with the coupling line. In this example, TL$_1$ 706 and TL$_2$ 708 are feed lines for the input and output port. The coupling line, i.e., the shorted-coupled line, is defined as a two-node connection network, where the inner side of Node A 712 and Node B 714 are connected to capacitor (C$_O$). On the other side, Node A 712 and Node B 714 are also connected to the input-output feed lines, respectively. As shown in FIG. 8, the long axis of the transmission lines TL$_1$ 706 and TL$_2$ 708 are aligned. The coupling lines include a first portion extending perpendicularly from the first transmission line TL$_1$, 706 and a second portion extending perpendicularly from the second transmission line TL$_2$ 708, and a third portion arranged between the first and second portions and connected to ground. The long axes of the first and second portions are, in general, parallel.

In this embodiment, the odd-mode ABCD matrix of a shorted-coupled line can be expressed as $$\begin{bmatrix} A & B \\ C & D \end{bmatrix}_{odd} = \begin{bmatrix} 1 & 0 \\ -jY_{1o}\cot\theta_1 & 1 \end{bmatrix} \quad (24)$$

while the even-mode ABCD matrix of this shorted-coupled line can be expressed as $$\begin{bmatrix} A & B \\ C & D \end{bmatrix}_{even} = \begin{bmatrix} 1 & 0 \\ -jY_{1e}\cot\theta_1 & 1 \end{bmatrix} \quad (25)$$

where $\theta_1$ is the electrical length of end short-circuited coupled line.

At low frequency, the impedance between Node A 706 and Node B 708 is relatively large because of the stopband characteristics of the capacitor. Under this condition, the corresponding even/odd mode S-parameters of the defined two-port network are $$S_{11e} = \frac{j\cot\theta_1}{2 - j\cot\theta_1} \quad (26)$$

$$S_{11o} = \frac{j\cot\theta_1}{2 - j\cot\theta_1}$$

$$S_{21e} = \frac{2}{2 - j\cot\theta_1} \quad (27)$$

$$S_{21o} = \frac{2}{2 - j\cot\theta_1}$$

The S-parameters can be calculated as $$S_{11} = \frac{1}{2}(S_{11e} + S_{11o}) = \frac{j\cot\theta_1}{2 - j\cot\theta_1} \quad (28)$$

$$S_{21} = \frac{1}{2}(S_{21e} - S_{21o}) = 0$$

which shows that the HEC 702 has a stopband frequency response at the low frequency.

At high frequency, the impedance between Node A 712 and Node B 714 decreases to a relatively small value, which results in the signal being shorted by the path between Node A 712 and Node B 714. Consequently, the high-frequency signal transfers directly from TL$_1$ 706 to TL$_2$ 708 through C$_O$, i.e., bypassing the coupling line.

Figure 9B:
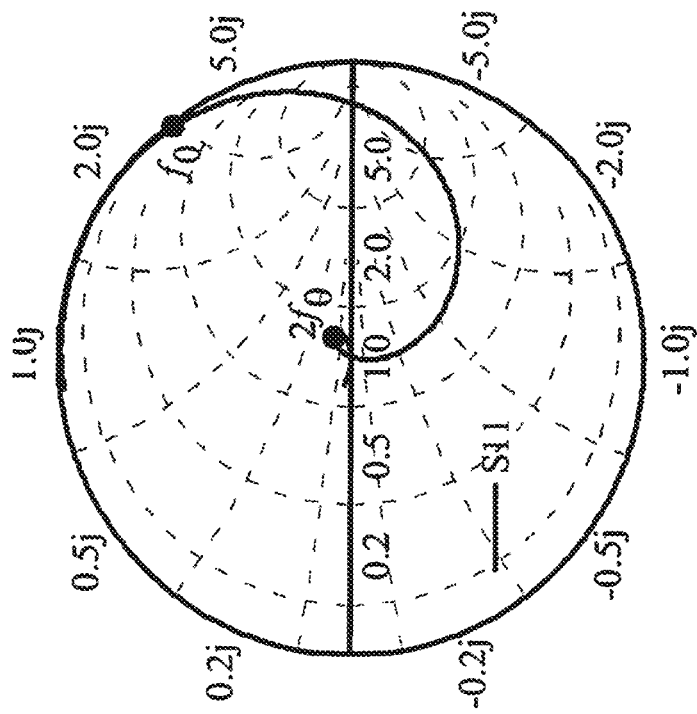
FIG. 9B is a Smith chart showing frequency response of the harmonic extracting circuit of the harmonic injection circuit of FIG. 7.
Figure 9A:
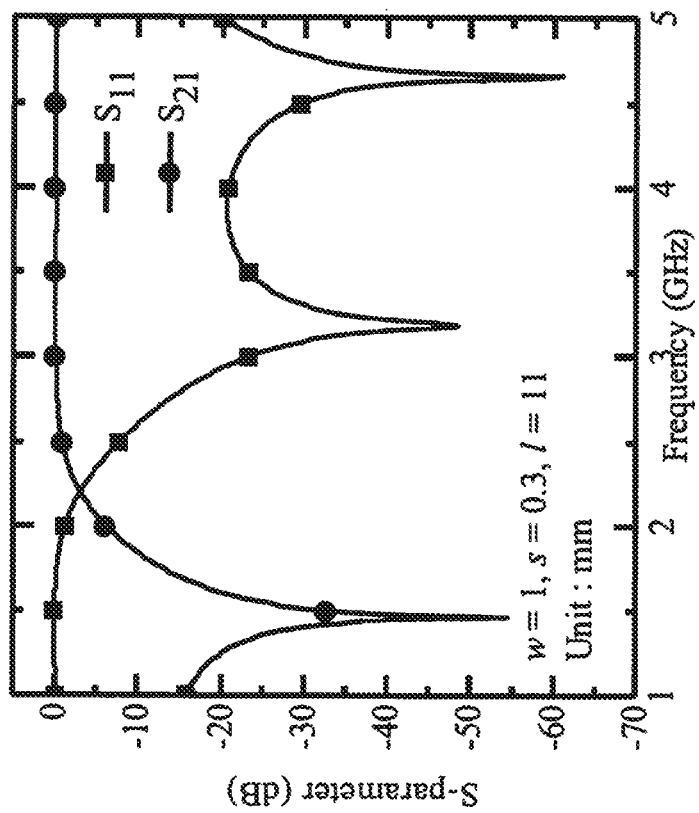
FIG. 9A is a S-parameter graph showing frequency response of the harmonic extracting circuit of the harmonic injection circuit of FIG. 7.

To verify the performance of HEC 702 construction of FIGS. 7 and 8, the full-wave simulated frequency response of the HEC 702 was tested in a 50Ω system. The frequency response is shown in S-parameter graph of FIG. 9A and on the smith chart of FIG. 9B. The second-harmonic injection offset line ("offset line 2") is cascaded and arranged to satisfy the 180° phase requirement of the whole HIN.

The DPA 100 of the present embodiment includes the input side network, the load modulation network (including 2 FIIs, an offset line, and a HIN), and the PMN. The following presents a four steps design procedure for systematically designing a DPA of one embodiment of the invention. In this example, the circuit is designed using Rogers substrate 4003C ($\varepsilon_r$=3.38 and h=0.813 mm).

Figure 10:
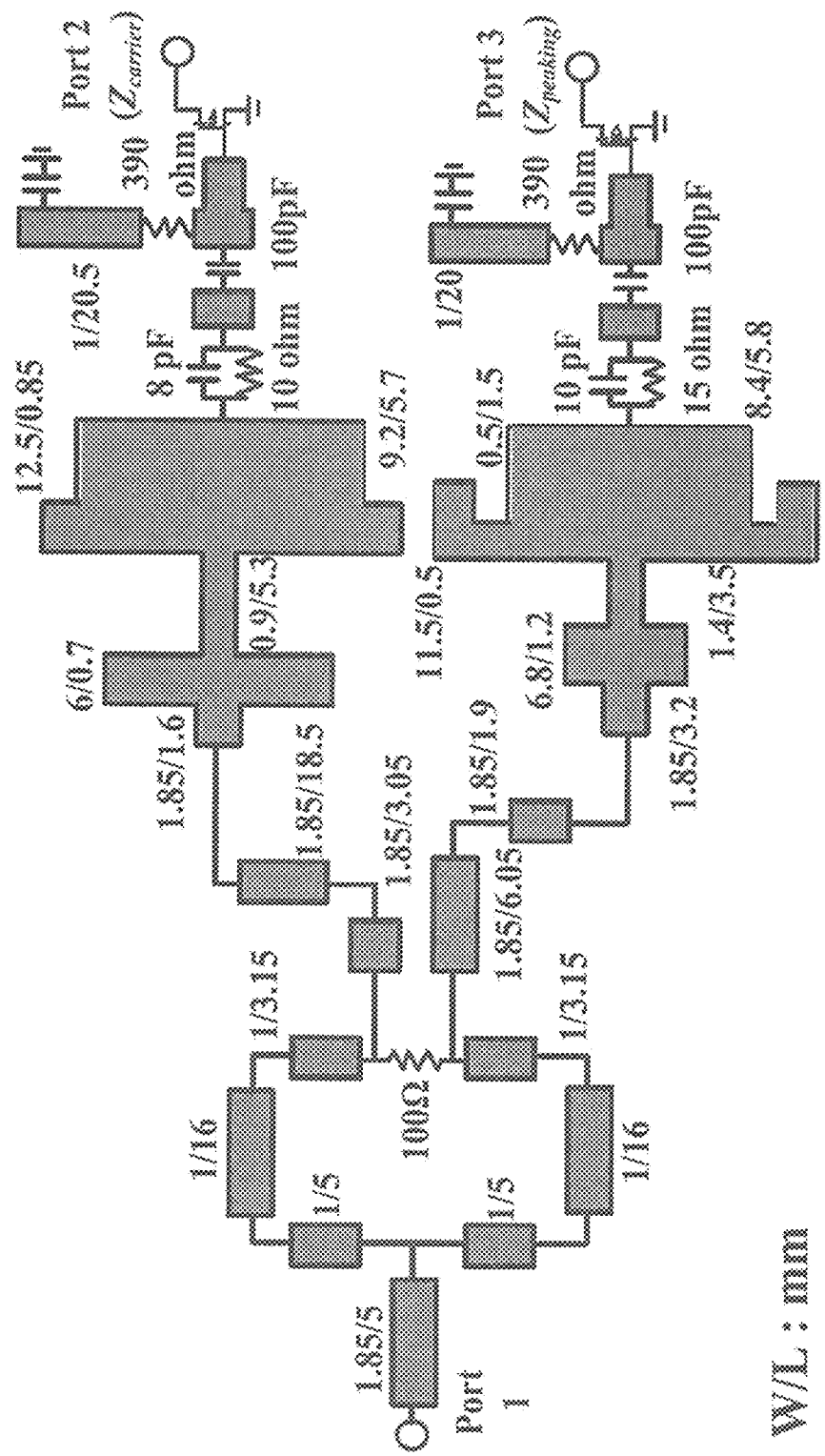
FIG. 10 is a schematic diagram of the input side circuit of FIG. 1 illustrating the dimensions of its different parts in one embodiment of the invention.

The first step of the design procedure involves designing the input side network. The input side network of the DPA in one embedment of the invention includes, as described above, the IPS, OL, IMNs, drain bias, and stabilization networks. The exemplary dimensions and construction of the input side network are shown in FIG. 10.

In this example, the input side network is similar to the conventional input networks used for DPAs. Similarly, the LC SN should be tuned properly to realize stable operating conditions and flatness of small signal gain within the operating frequency.

Figure 11:
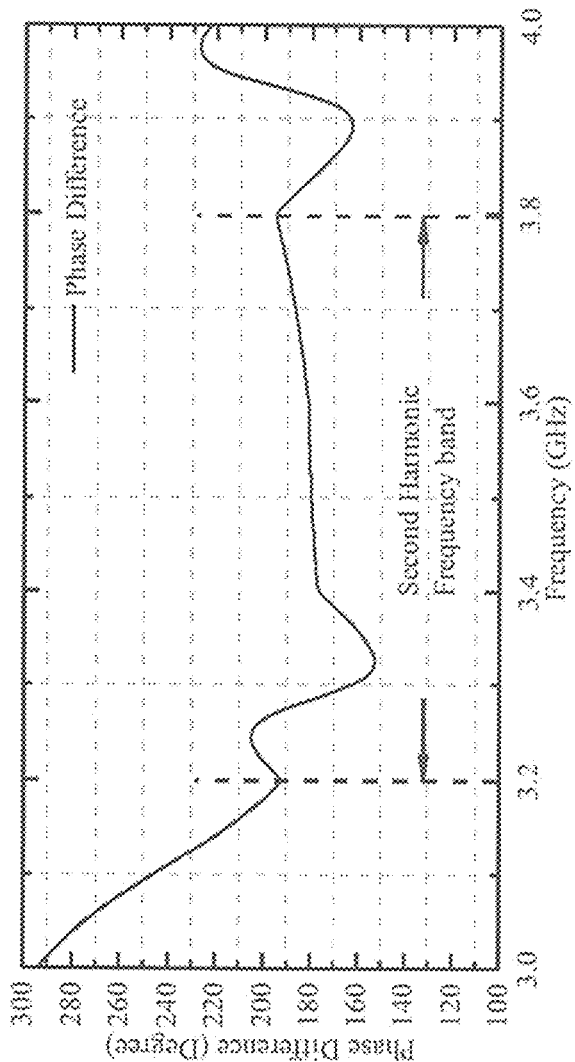
FIG. 11 is a graph showing second harmonic phase difference between the carrier device and the peaking device of FIG. 2.

With the aid of offset line before the IMN of the carrier device, the gate excitation signal between carrier and peaking is at phase quadrature. Also, a 180° phase difference at the second harmonic (shown in FIG. 11) is required for the harmonic injection technique.

Figure 12:
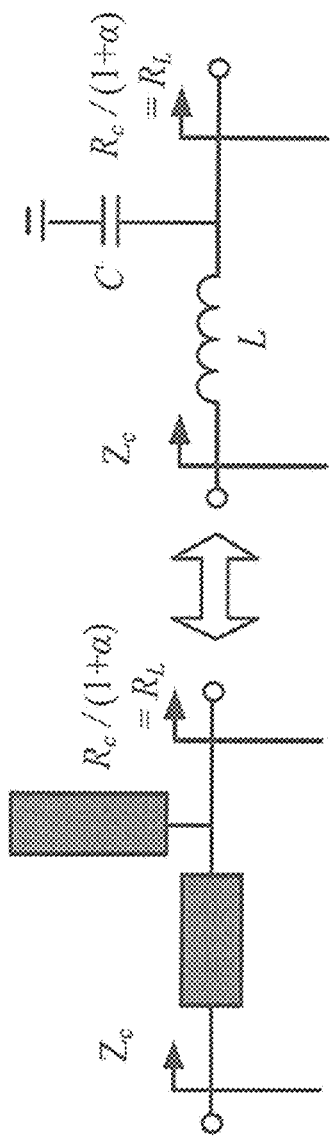
FIG. 12 is schematic diagram showing the circuit (and its equivalent circuit) of the fundamental impedance inverter in the DPA of FIG. 1 in one embodiment of the invention.

The second step of the design procedure involves designing the fundamental impedance inverter and the offset line in the load modulation network. Before designing of FII, the optimal drain impedance of carrier ($Z_{c,sat}$) and peaking ($Z_{p,sat}$) device should be obtained using load pull which was performed using Keysight ADS simulation software. From the variation trend of the optimal impedances required by the carrier PA in J. Pang, S. He, C. Huang, Z. Dai, J. Peng, and F. You, "A post-matching Doherty power amplifier employing low-order impedance inverters for broadband applications," IEEE Trans. Microw. Theory Techn., vol. 63, no. 12, pp. 4061-4071, December 2015, the Doherty region requires a kind of impedance transformation which keeps the real part invariant while making the imaginary part decrease as seen within the package. To achieve this, the carrier FII adopts the L-type configuration, which can be considered as an LC tank equivalent circuit, shown in FIG. 12. The $Z_c$ is expressed as $$Z_c = j\omega L + \frac{1}{j\omega C + \frac{1}{R}} \quad (29)$$

This expression can be expanded to its real and imaginary parts as $$Z_c = \frac{R}{1 + R^2\omega^2 C^2} + j\left(\omega L - \frac{\omega C}{\omega^2 C^2 + \frac{1}{R^2}}\right) \quad (30)$$

Considering the load modulation leads to $R_c$ changing from $R_L$ (back off) to $(1+\alpha)R_L$ (saturation) and that it is required that the real part of $Z_c$ does not change at $\omega_0$, we have $$\frac{R_L}{1+R_L^2\omega_0^2 C^2} = \frac{(1+\alpha)R_L}{1+((1+\alpha)R_L)^2\omega_0^2 C^2}. \quad (31)$$

From equation (31), $\omega_0$ is calculated as $$\omega_0 = \sqrt{\frac{1}{(1+\alpha)C^2 R_L^2}}. \quad (32)$$

Therefore, the real part of $Z_{c,sat}$ at $\omega_0$ has a relationship of $R_L$ and $\alpha$:

$$\text{Re}[Z_{c,sat}] = \frac{R_L(1+\alpha)}{2+\alpha} \quad (33)$$

Based on the above, the value of C can be determined by equation (32) and L should be tuned to an appropriate value based on load-pull data.

For the peaking device with L-type FII, it will suffer from the impedance transformation ratio (TR) of $R_{p,sat}/Z_{p,sat}$. Thus, offset line 1 is introduced to connect two FIIs for signal combining. Theoretically, the electrical length of offset line 1 should be 90° at $f_0$ to compensate for the phase difference between the two signal paths. The impedance of offset line 1 ($Z_{offset1}$) should be equal to $R_{p,sat}$ in order to avoid power loss. According to equation (10), $Z_{offset1}$ can be expressed as $$Z_{offset1} = R_{p,sat} = (1+1/\alpha)R_L \quad (34)$$

Figure 13:
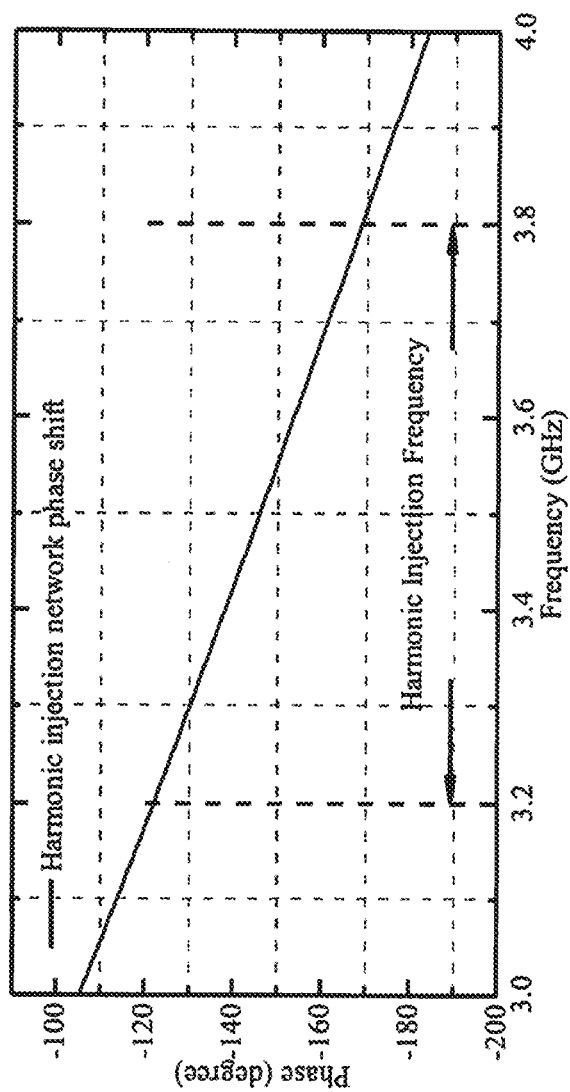
FIG. 13 is a graph showing simulated phase shift of the harmonic injection circuit of FIG. 7.

The third step of the design procedure involves designing the harmonic injection network in the load modulation network. First, the phase requirement for the HIN is theoretically 180°. However, due to internal parasitic effects of the carrier and peaking devices, the HIN phase shift deviates from this in practice. Second, the capacitor ($C_0$) should be selected with a high-Q factor to minimize power loss. One example of the capacitor ($C_0$) is the muRata GQM 18 series capacitor. Third, the impedance of offset line 2 should be chosen carefully. This is because the larger insertion loss of second harmonic is obtained with high impedance, while the undesirable fundamental leakage is caused by low impedance. Eventually, the length l should be further tuned when HIN is integrated into the post-matching DPA topology for stopping the fundamental components. The simulated phase shift of the HIN in a 50Ω system is shown in FIG. 13.

As the HIN in this embodiment adopts a "low-pass filter with offset line" type configuration, this results in the large phase slope variation, which limits the effective 180° phase condition to a narrowband and consequently, that of the DPA of the present embodiment.

By the end of step 3, the entire load modulation network has been fabricated and its dimensions in one embodiment are shown in FIG. 14.

The detailed equivalent circuit of the proposed load modulation network is shown in FIG. 15. The carrier- and peaking-impedance inverter can be considered to be an LC circuit ($L_1$=2 nH, $C_1$=2.7 pF, $L_2$=2.4 nH, and $C_2$=3 pF, respectively). Whereas, the fundamental and second-harmonic offset lines (offset line 1, offset line 2, and offset line 2') are equivalent with the inductors as 7, 4, and 0.3 nH, respectively. For the HEC, the equivalent even/odd mode impedance and electrical length of shorted-coupled line are 84.7Ω, 49.7Ω, and 38.1°, which is paralleled with a capacitor ($C_0$=1 pF).

The final, fourth step of the design procedure involves designing the post-matching network. In this embodiment, a conventional high-order low-pass topology is adopted for the PMN (shown in FIG. 16). Its main function is for maximum power transfer of the combined signal to the 50Ω system load ($R_0$). $T_R$ of the PMN can be expressed as $$T_R = R_0/R_{C,N} \quad (35)$$

Figure 17:
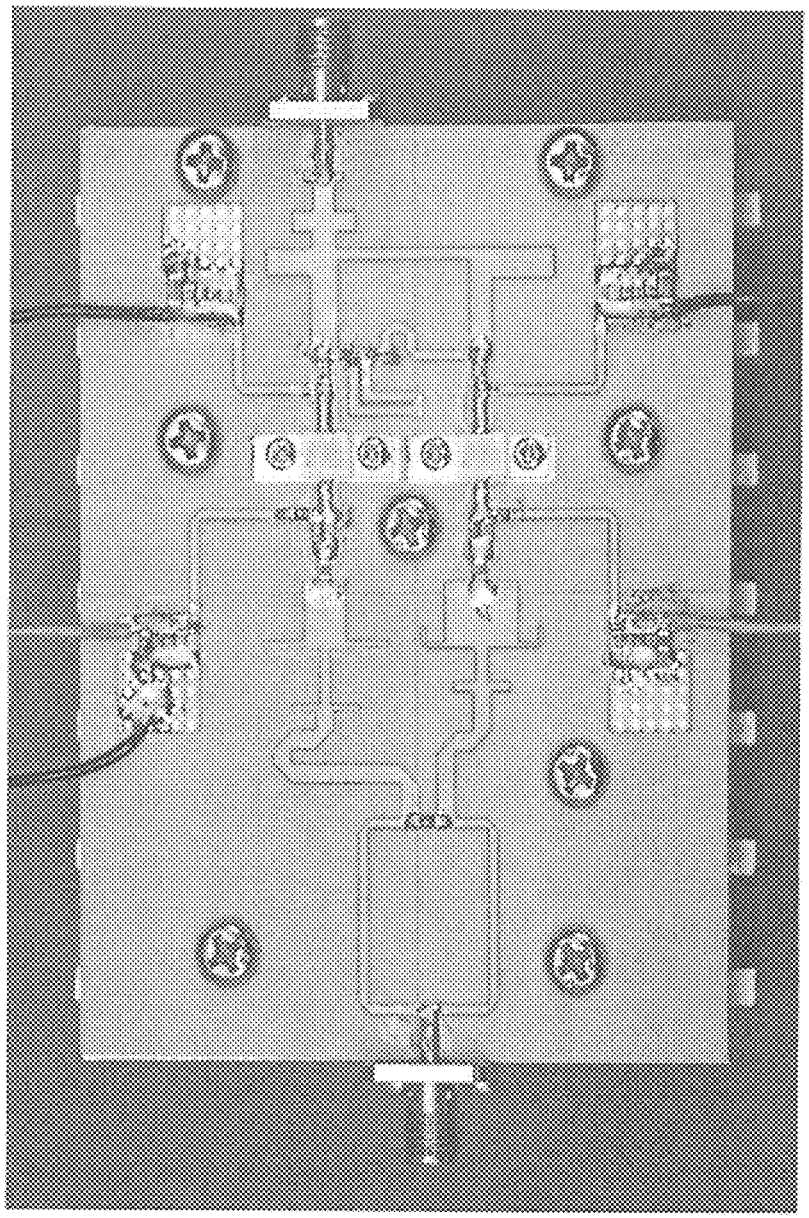
FIG. 17 is a photograph of a DPA fabricated based on the configuration illustrated in FIG. 1.
Figure 18:
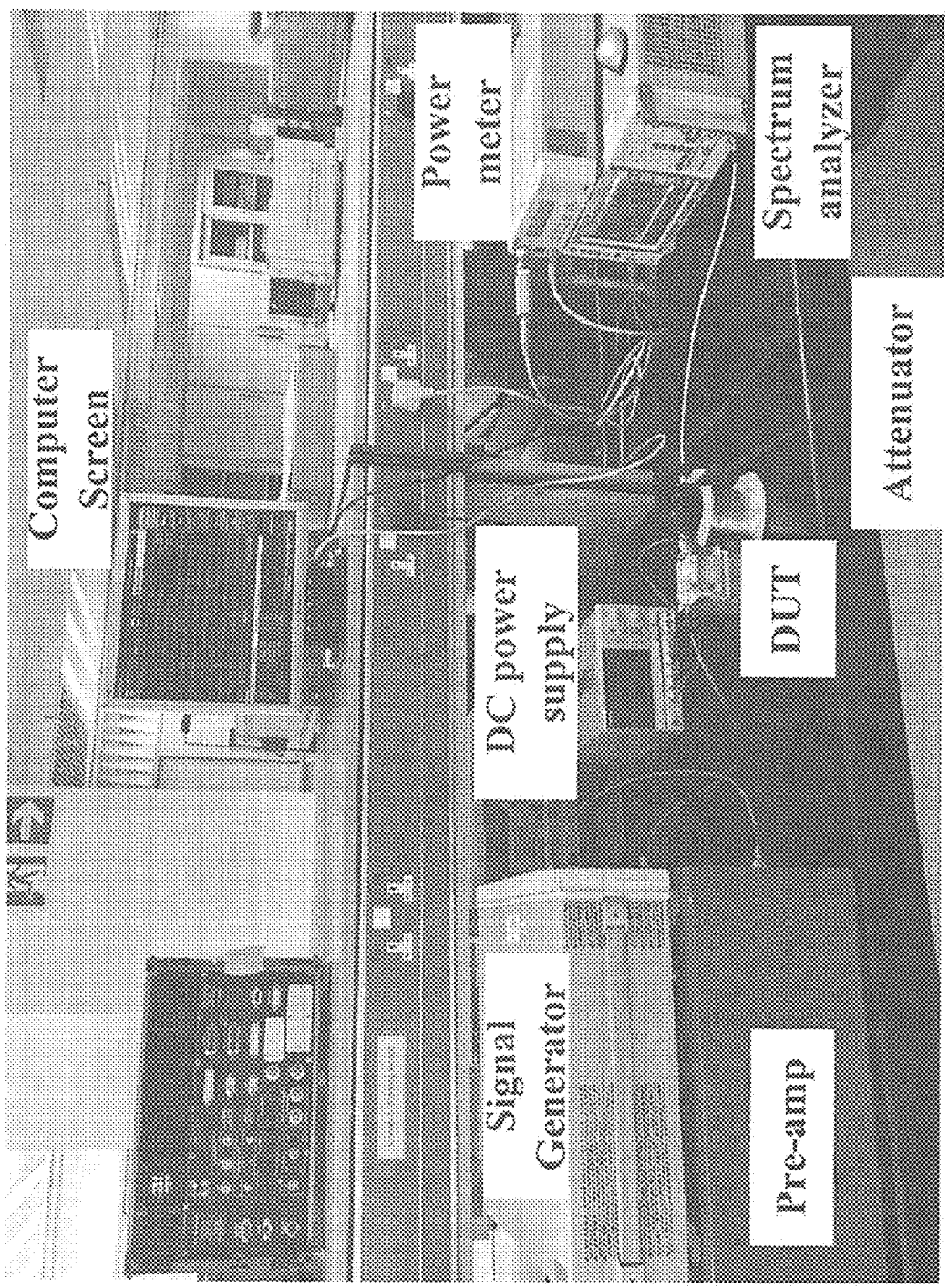
FIG. 18 is a photograph of an experimental set-up for testing the performance of the DPA of FIG. 17.

After all the four steps in the design procedures are completed, a post-matching DPA with extended back-off region in one embodiment of the invention can be achieved. Photographs of the DPA so fabricated and the test bench are shown in FIGS. 17 and 18 respectively.

For comparison, a post-matching DPA with the same asymmetrical drain bias configuration but without a HIN was designed and simulated for use as reference. The reference case should have a $R_{C.N.}$ same as the simulation results for the DPA of the present embodiment. Both load conditions of the reference DPA at back-off point and saturation should be equal to equations (6)-(12). Namely, the reference case should have the same back-off efficiency and back-off output power as the DPA of the present embodiment. With this arrangement, their back-off value, power utilization factor, and drain waveforms can be fairly compared. The reference case uses an identical input side and PMN as that of the DPA of the present embodiment.

Figure 19:
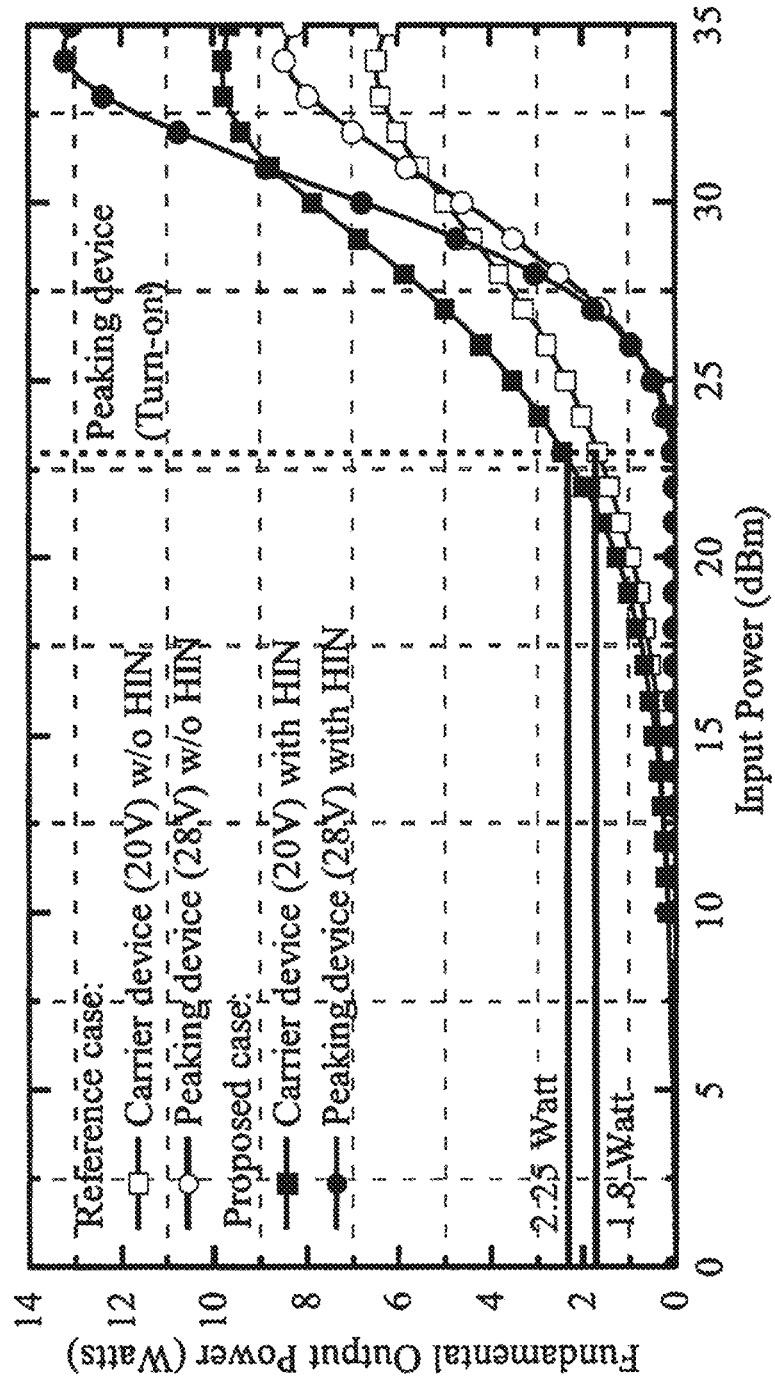
FIG. 19 is a graph showing simulated fundamental output power at the carrier device and at the peaking device at different input power, for the cases with the harmonic injection circuit (like the one of FIG. 17) and without the harmonic injection circuit.

Simulated carrier and peaking output power of the reference DPA and of the DPA of the present embodiment are shown in FIG. 19, to more clearly demonstrate the increased output power of the DPA of the present embodiment. For the DPA of the present embodiment (with HIN; carrier: 20 V, peaking: 28 V), the $P_{sat,p}$ and $P_{sat,c}$ are 13 and 9.6 W, and $P_{back-off,c}$ is 2.25 W, leading to an $\alpha$ value of 1.354 and a $\beta_d$ value of 4.174, while for the reference DPA, the $P_{sat,p}$ and $P_{sat,c}$ are 8.2 and 6 W and $P_{back-off,c}$ is 1.8 W, resulting in an $\alpha$ value of 1.36 and a $\beta_d$ value of 3.33.

To better clarify the contributions of the invention, an ideal 6-dB DPA is also introduced. In Table I below, the OBO enhancement of the DPA of the present embodiment can be observed (9.92 dB versus 8.95 dB versus 6 dB). This substantial back-off improvement is closely related to the larger value of $\beta_d$ (4.174 versus 3.33 versus 2). This is because in the DPA of the present embodiment, the carrier device (under 20-V drain bias) can generate a higher $P_{sat,c}$ compared with the reference case, while $P_{back-off,c}$ is almost unchanged. Meanwhile, the $\alpha$ value of the DPA in the present embodiment remains unchanged when compared with the typical asymmetrical drain biased DPA (1.354 versus 1.36 versus 1). This benefits from both power enhancement of carrier and peaking device (13/9.6 versus 8.2/6). In short, the asymmetrical drain bias configuration extends the back-off region from 6 to 8.95 dB by increased $\alpha$. After that, the HIN in the DPA of the present embodiment further enlarges the value of $\beta_d$ while maintain the same value of $\alpha$. As a result, further back-off extension from 8.95 to 9.92 dB can be achieved.

TABLE I

PARAMETERS OF OBO RANGE IN FIG. 19

| Case | Drain bias | $\alpha^1$ | $\beta_d^2$ | OBO (dB)[3] |
|---|---|---|---|---|
| Ideal 6 dB case | Carrier: 28 V<br>Peaking: 28 V | 1 | 2 | 6 |
| Reference case<br>(Without HIN) | Carrier: 20 V<br>Peaking: 28 V | 1.36<br>(8.2 W/6 W) | 3.33<br>(6 W/1.8 W) | 8.95 |
| Proposed case<br>(With HIN) | Carrier: 20 V<br>Peaking: 28 V | 1.354<br>(13 W/9.6 W) | 4.174<br>(9.6 W/2.25 W) | 9.92 |

[1] $\alpha$: $P_{sat,p}/P_{sat,c}$.
[2] $\beta_d$: $P_{sat,c}/P_{back-off,c}$.
[3] OBO range: $10 \log[(1+\alpha)/\beta_d]$.

Figure 20:
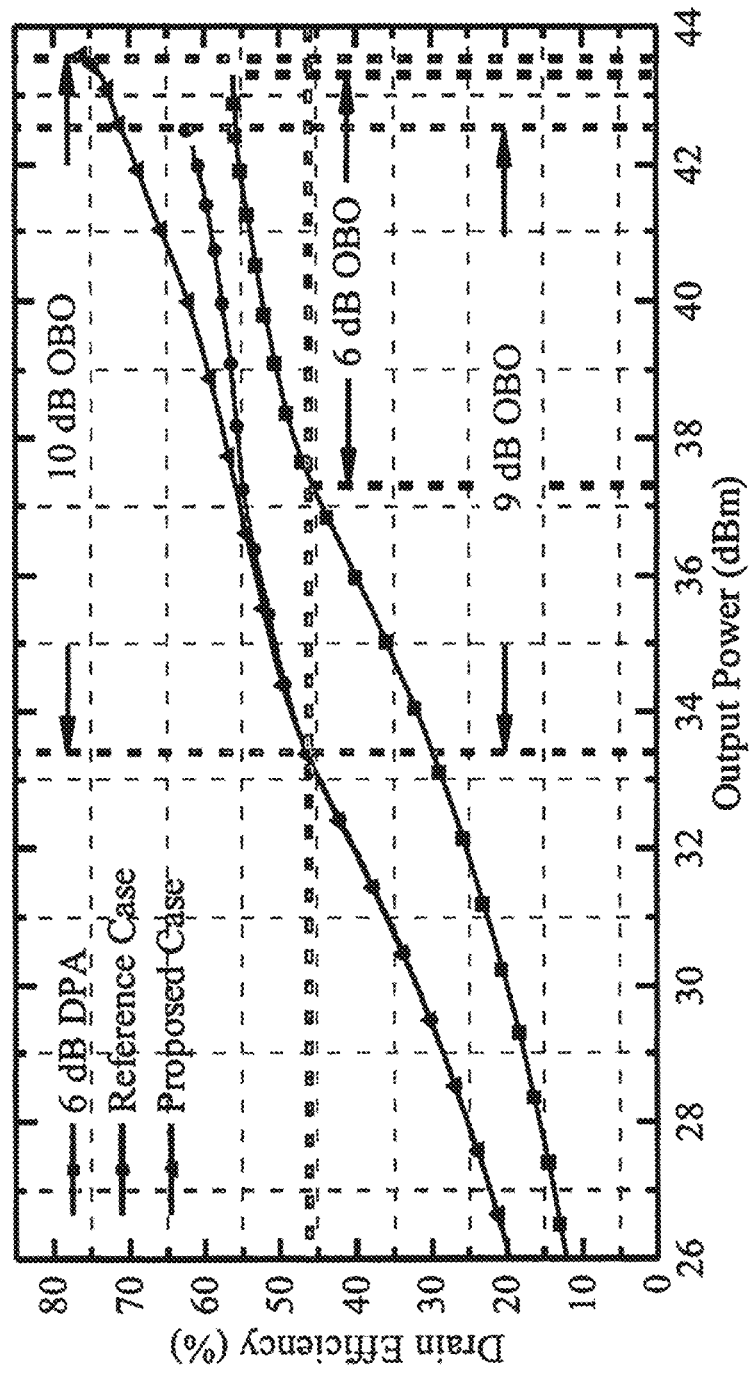
FIG. 20 is a graph showing simulated drain efficiency (DE) at different output power, for the cases with the harmonic injection circuit (like the one of FIG. 17), without the harmonic injection circuit, and using 6 dB DPA.

The simulated drain efficiency (DE) versus output power at f0 for the three cases is shown in FIG. 20. With the dual-harmonic injection technique of the present embodiment, the back-off region of the DPA of the present embodiment is extended to 10 dB and an increase in efficiency at saturation is achieved.

Figure 21:
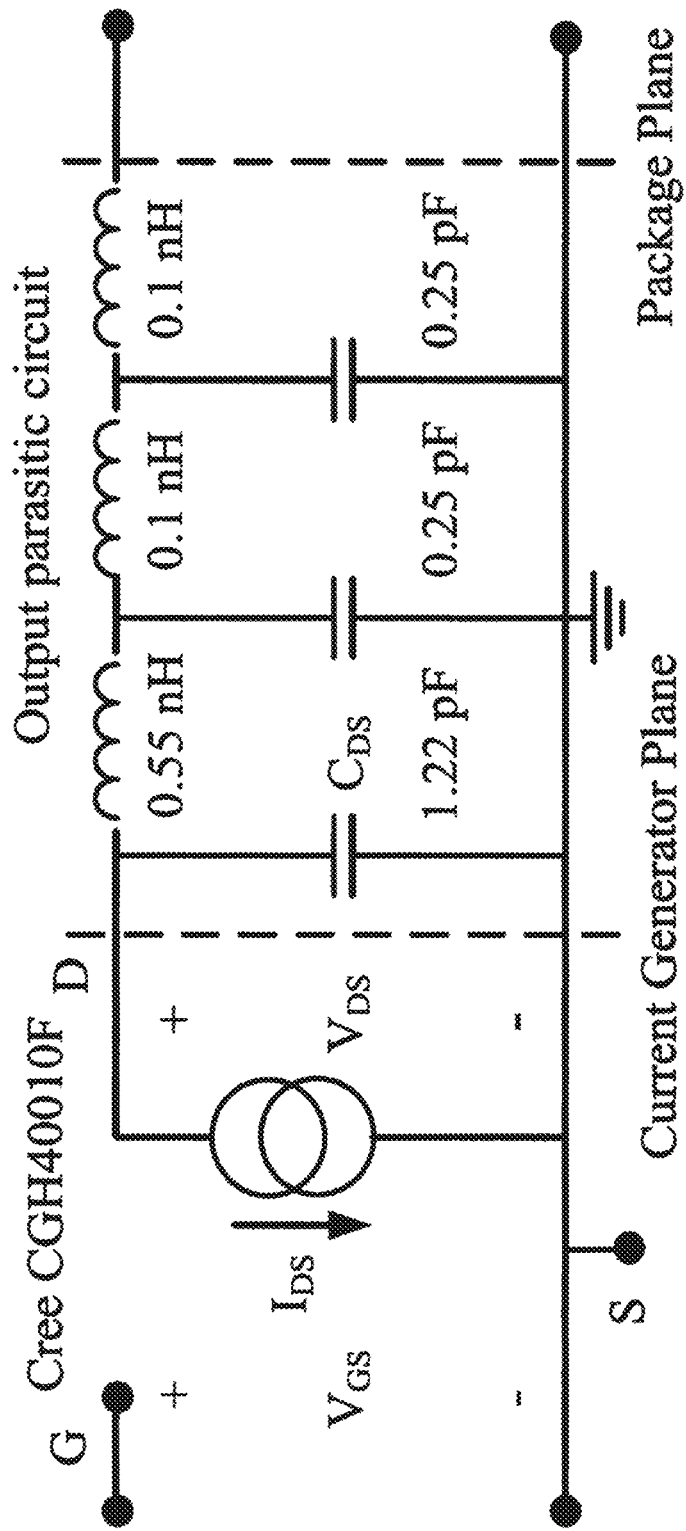
FIG. 21 is an equivalent circuit of the device adopted for the de-embedding and obtaining intrinsic drain waveforms of the carrier and peaking devices of the DPA of FIG. 17 at saturation.

Based on the circuit dimensions mentioned above (for the present embodiment and for the reference case), the de-embedding of a commercial large-signal model of CGH40010F (shown in FIG. 21) is utilized to obtain the intrinsic drain waveforms of carrier and peaking devices at saturation. Intrinsic drain waveform of the reference DPA and DPA of the present embodiment is shown in FIG. 22.

For the reference case, the voltage amplitude of the carrier device does not exceed 40 V because of its lower drain bias (20 V). The carrier current amplitude has a rectangle shape due to operation in deep saturation. The peaking device (28 V) exhibits a nonlinear current bifurcation due to its class-C bias. For the DPA of the present embodiment, the phase offset between carrier drain current and voltage waveform is separated because of the negative $Re\{Z_{c,sat}\text{ at }2f_0\}$. In other words, the carrier device operates like a "class-J" PA at saturation. Consequently, the overlap between voltage and current is decreased and this enhances efficiency. The enhanced voltage and current amplitude generates an additional fundamental power compared with the reference DPA. Also, the peaking voltage and current amplitude can be modulated at a higher level and the current bifurcation remains because of its class-C bias. Hence, the fundamental output power will be increased. As can be expected, the saturated efficiency of the DPA of the present embodiment will be higher than the conventional AB-C DPA because of the enhanced higher efficiency.

Figure 23:
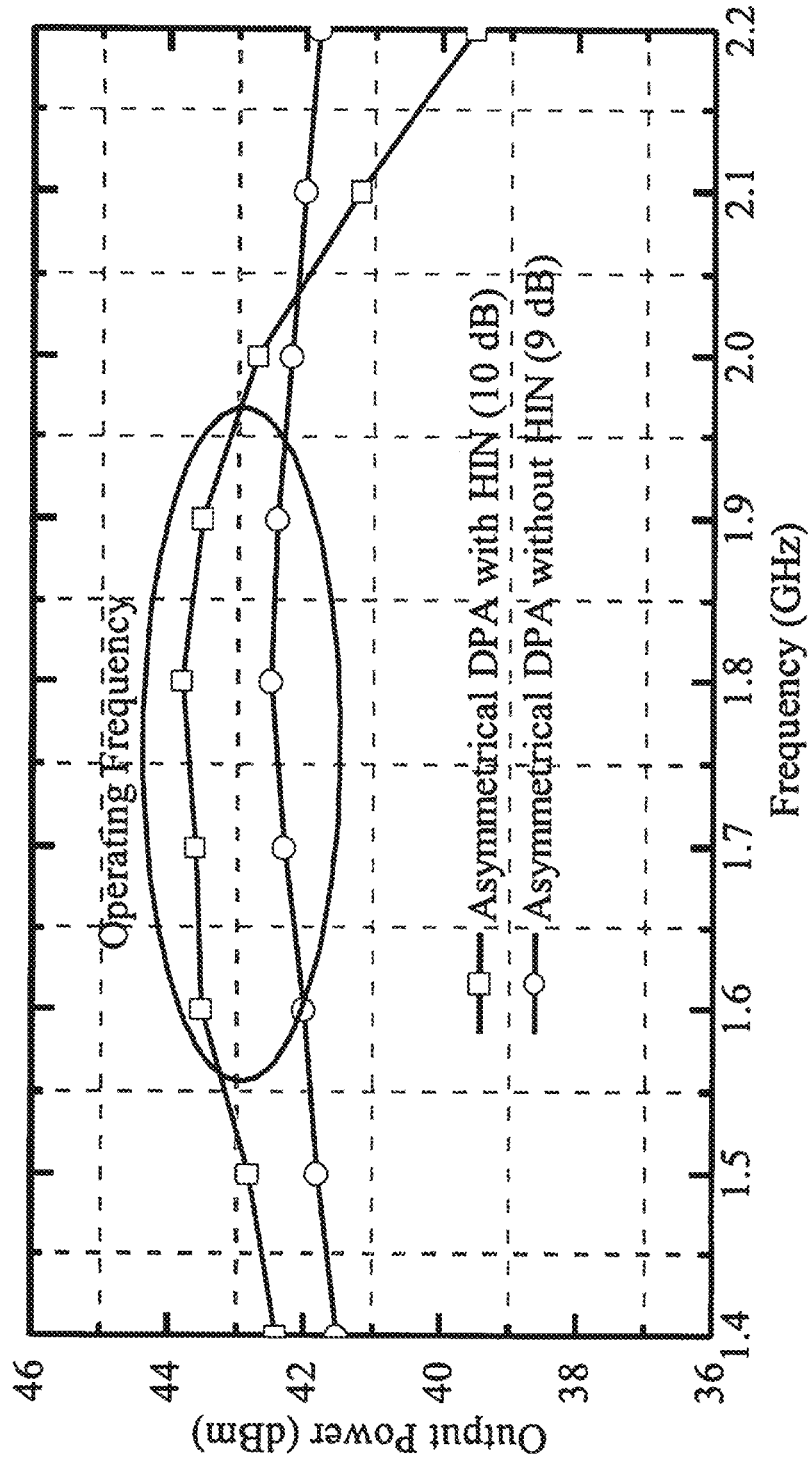
FIG. 23 is a graph showing simulated saturated output power of an asymmetrical DPA with the configuration of FIG. 17 at different frequencies, for the cases with harmonic injection and without harmonic injection.

To demonstrate the improvement of the DPA of the present embodiment, simulated saturated power of the reference DPA and the DPA of the present embodiment at different frequencies is shown compared in FIG. 23. Compared with the reference DPA, output power of the DPA of the present embodiment is enhanced. It can be observed that the DPA of the present embodiment sacrifices bandwidth. Considering that the invention focuses mainly on the extension of back-off region and designed for WCDMA systems (narrowband system), a sacrifice in bandwidth is acceptable.

Figure 24:
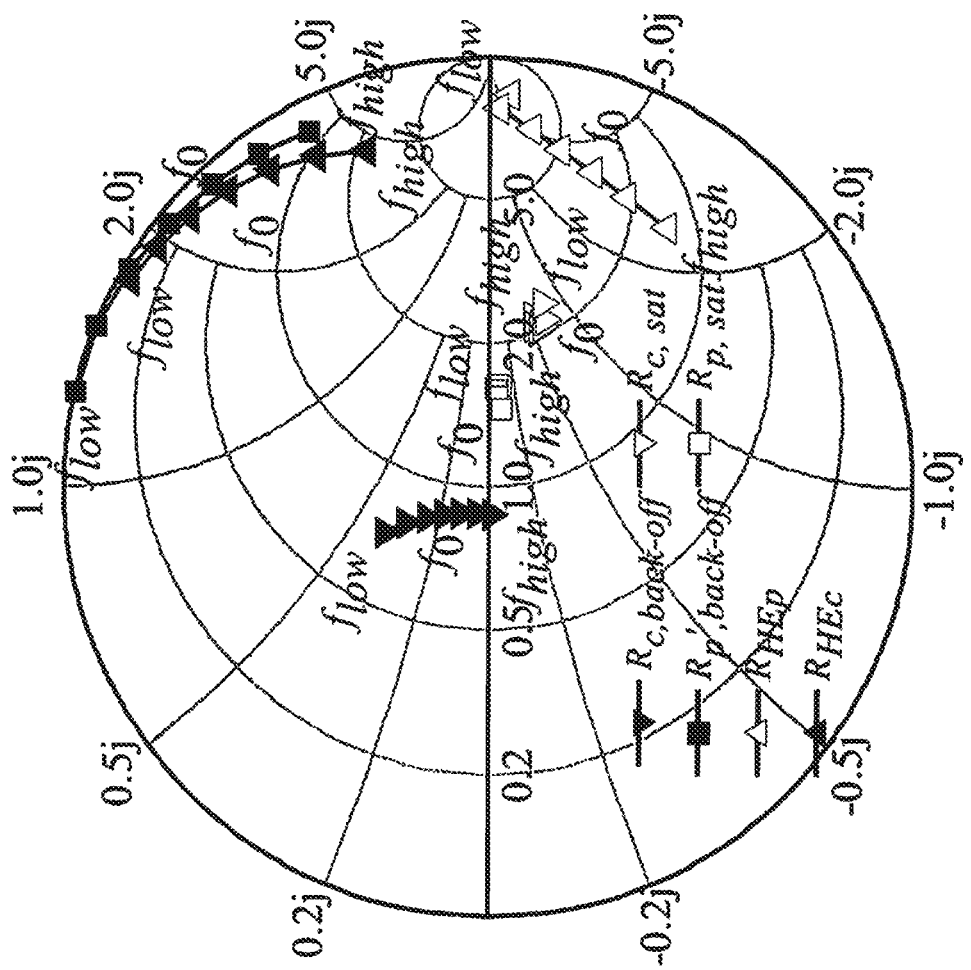
FIG. 24 is a Smith chart showing simulated load conditions of the DPA with the configuration of FIG. 17 at low power and Doherty region over entire operating frequency range.

To verify the theoretical analysis mentioned in equations (6)-(12), simulated load conditions of the DPA of the present embodiment at back-off point and saturation within the entire operating frequency are shown in FIG. 24, respectively. The $R_{c,back-off}$, $R_{c,sat}$, and $R_{p,sat}$ follow their relationship about $\alpha$. Meanwhile, $R_{HEC}$, $R'_{p,back-off}$ and $R_{HEp}$ are always located near the open circuit as seen on the Smith chart to stop the fundamental components.

Figure 25:
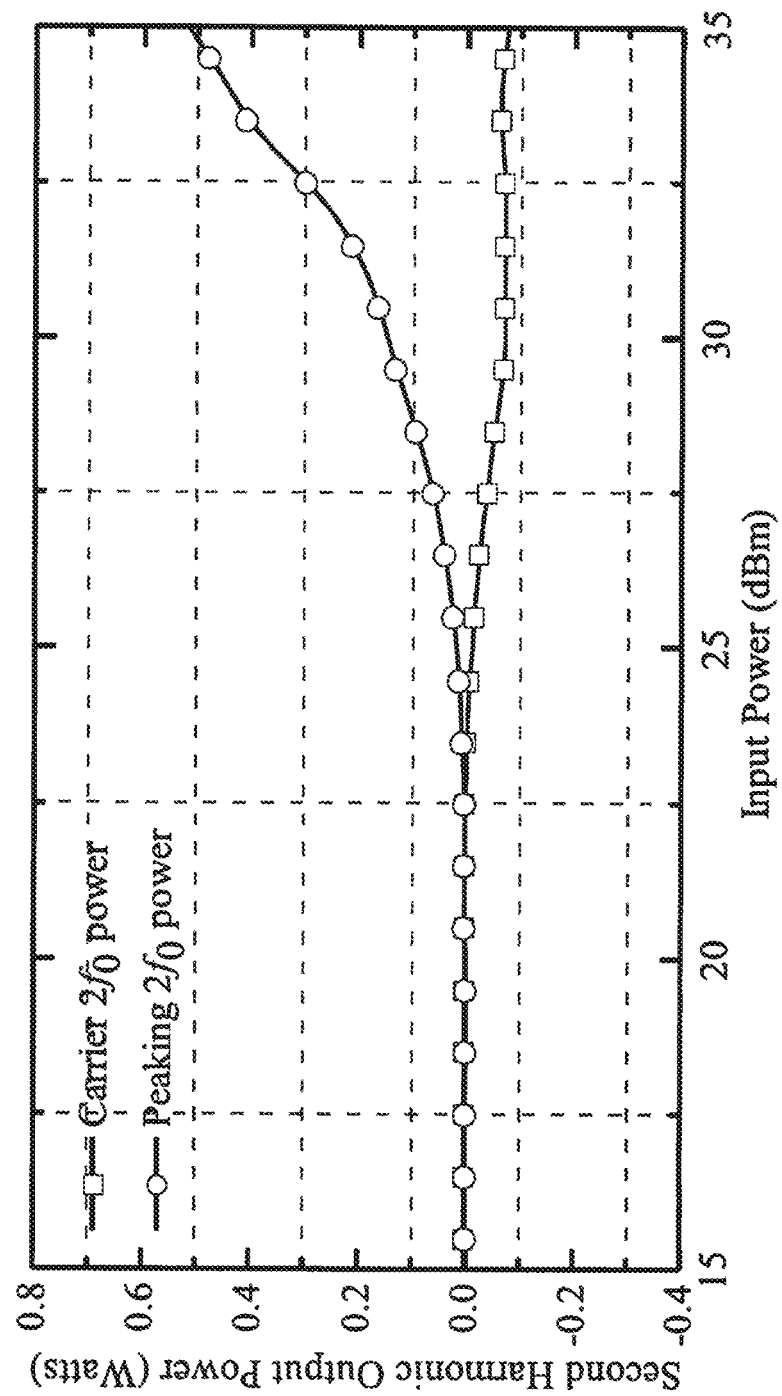
FIG. 25 is graph showing simulated carrier and peaking second-harmonic output power for different input power for the DPA with the configuration of FIG. 17.

FIG. 25 illustrates the simulated second-harmonic carrier and peaking output power versus input power for the DPA of the present embodiment. The results show that the second harmonic of the peaking device is much larger than that of the carrier as input power increases.

Figure 26B:
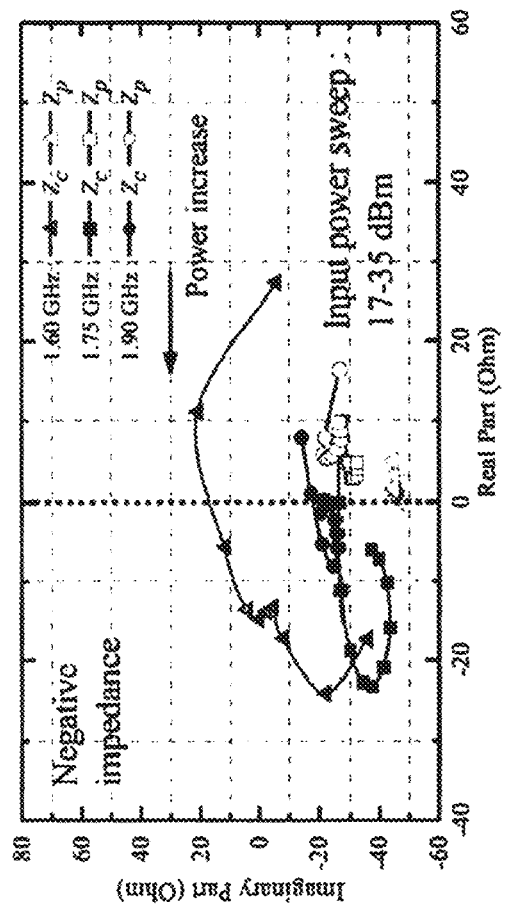
FIG. 26B is a graph showing carrier and peaking intrinsic drain impedance of the DPA trajectories (second-harmonic) of the DPA of FIG. 17 at different input power levels.
Figure 26A:
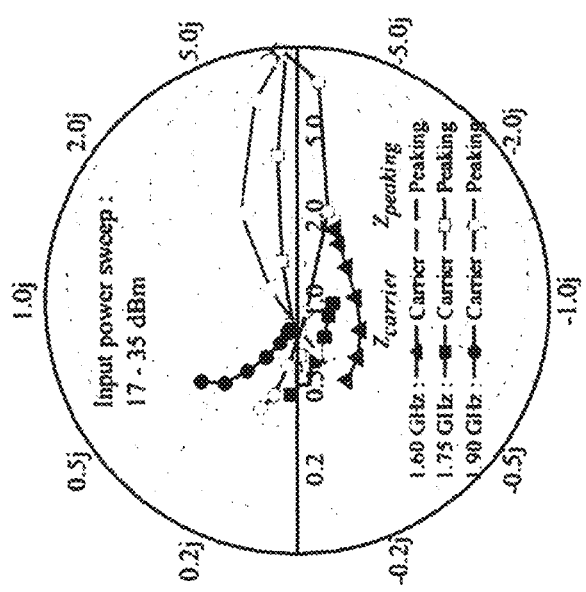
FIG. 26A is a Smith chart showing carrier and peaking intrinsic drain impedance of the DPA trajectories (fundamental) of the DPA of FIG. 17 at different input power levels.

Finally, carrier and peaking intrinsic drain impedance trajectories of the DPA of the present embodiment (fundamental and second harmonic) at different input power levels is shown in FIG. 26. As the proposed HIN introduces a mismatch at the fundamental frequency, the load modulation behavior cannot be satisfied perfectly over the entire operating frequency range. However, the intrinsic drain impedance behaviors can still be controlled to within an acceptable range. In terms of the second harmonic, with increasing input power, the real part of $Z_c$ at $2f_0$ goes into the negative impedance region and remains there even up the saturation. While for $Z_p$ at $2f_0$, the impedance always has a positive real part.

Figure 27:
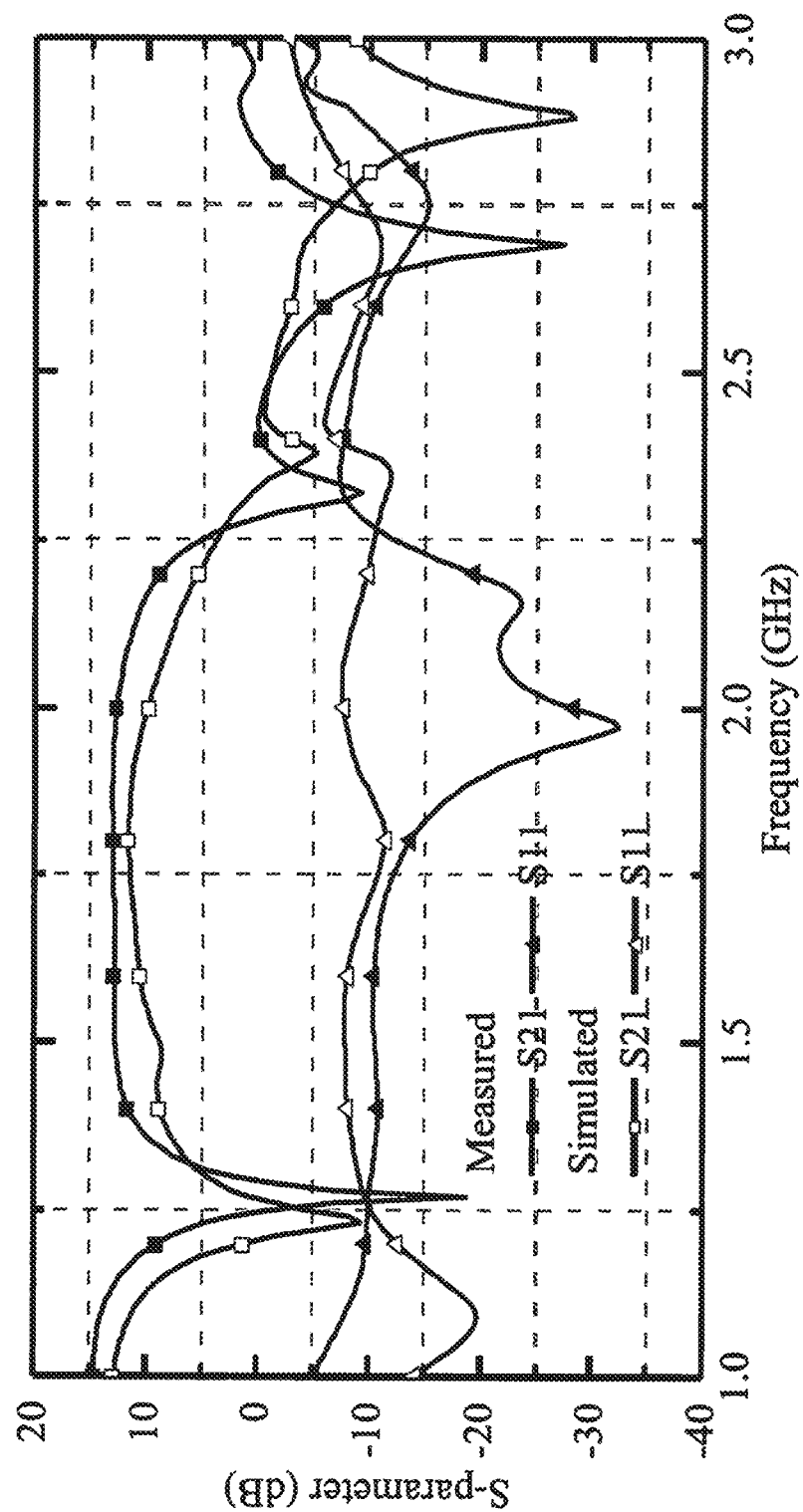
FIG. 27 is a graph showing simulated and measured small-signal performance of the DPA of FIG. 17.

To demonstrate the feasibility of the DPA topology of the above embodiments, a DPA using self-generated second-harmonic injection is implemented. The carrier (IDQ=60 mA) and peaking devices (biased at -5.8 V) are implemented suing identical 10-W GaN HEMT CGH40010F from Cree. Asymmetric drain bias is 20 V for carrier device and 28 V for peaking device, respectively. Simulated and measured small signal performances of the DPA of the present embodiment are shown in FIG. 27.

Figure 28:
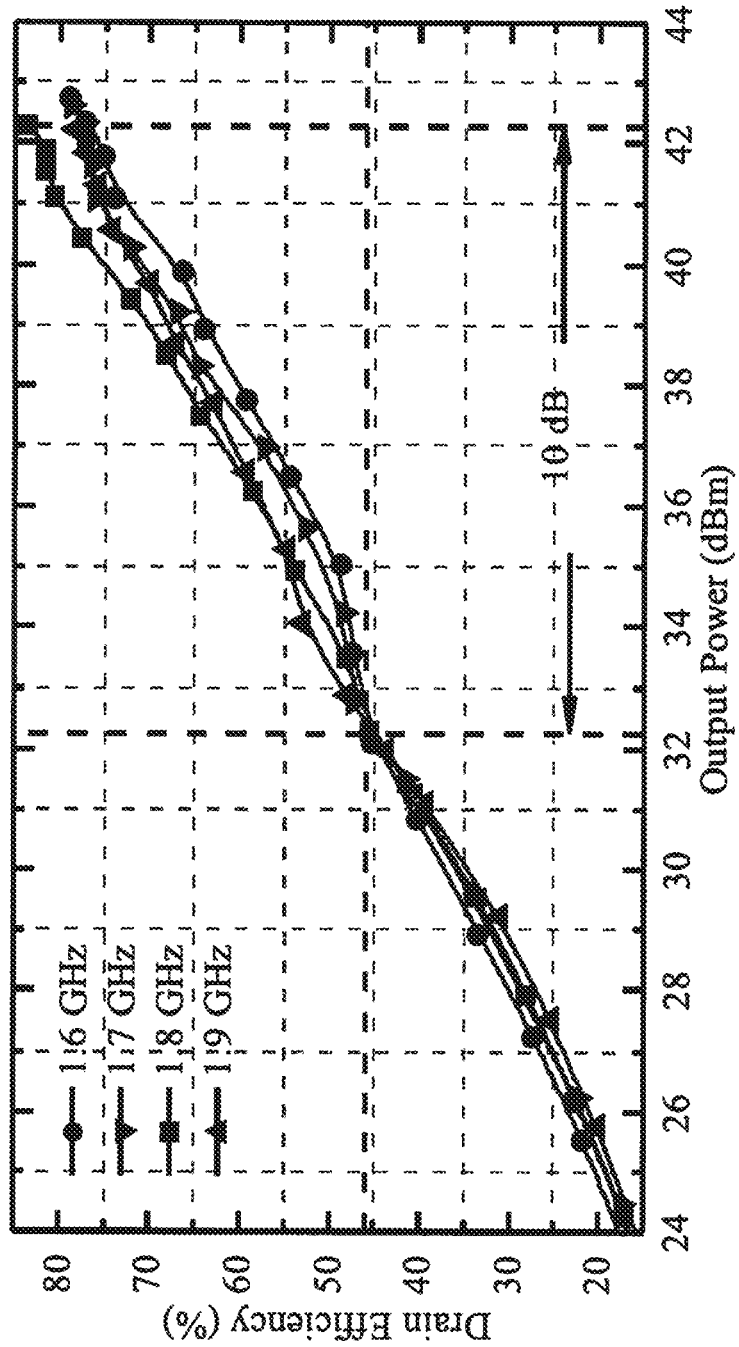
FIG. 28 is a graph showing measured drain efficiency versus output power within entire operating frequency of the DPA of FIG. 17.

Measured DEs versus output power over the entire operating frequency range are shown in FIG. 28. As shown in FIG. 28, at 10-dB back off, efficiencies of at least 46% can be obtained from 1.6 to 1.9 GHz, which corresponds to a bandwidth of 17.1%. The saturated DE ranges from 78.3% to 83%. Also shown in FIG. 28, the first efficiency peak in the DPA of the present embodiment is not so obvious. This is because the saturated efficiency of the DPA of the present embodiment exceeds 80%, which results in the diminished visibility of Doherty behavior.

Figure 29:
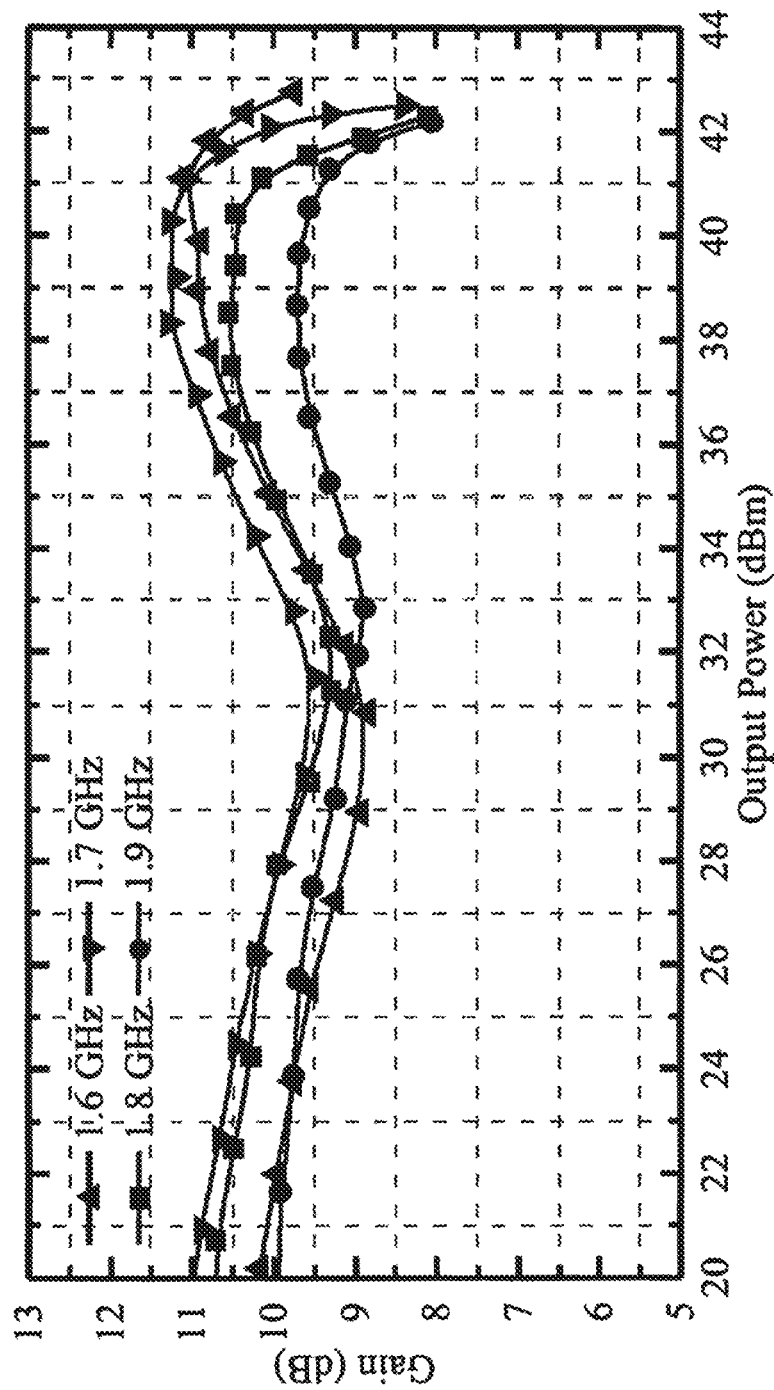
FIG. 29 is a graph showing measured gain at different output power within entire operating frequency of the DPA of FIG. 17.

Measured gain with respect to the output power is shown in FIG. 29. The gain decreases from 11 to 9.9 dB with varying output power with the compression point at saturation is less than 2.6 dB over the operating frequency band. A variation in gain can be observed, which is mainly due to two reasons. The first is that a lower carrier drain bias leads to an overdriven carrier device at the back-off point. Inevitably, the gain is compressed. The second reason is that both harmonic injection only occurs from back-off point to saturation, which results in a faster growth in output power. Correspondingly, the gain increases sharply after the back-off point.

Figure 30:
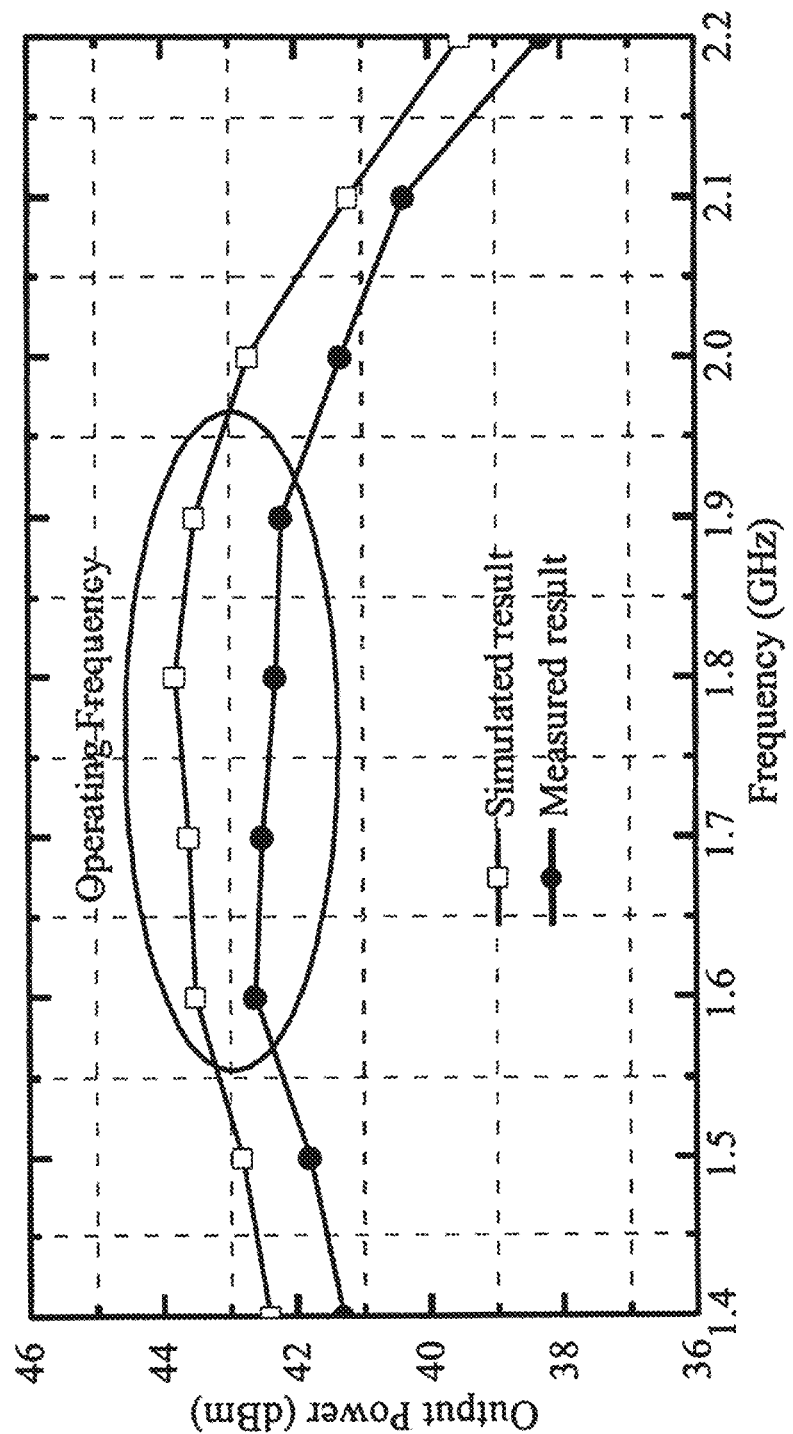
FIG. 30 is a graph showing simulated and measured saturated output power versus frequency of the DPA configuration of FIG. 17.

Due to the limited accuracy of the peaking amplifier simulation, the power from the peaking device is lower than the expected result. Moreover, the measured small signal gain (shown in FIG. 27) is slightly lower than simulation. This is because the transistor simulation model cannot provide the best accuracy with the drain bias used (20 V) which is different from the specified drain voltage (28 V). Consequently, the carrier device power at saturation is lower than that obtained from simulation. Although the measured saturated output power is lower than the simulation result, it is still within an acceptable range over the entire operating frequency. The simulated and measured saturated output power versus frequency is shown in FIG. 30.

Figure 31:
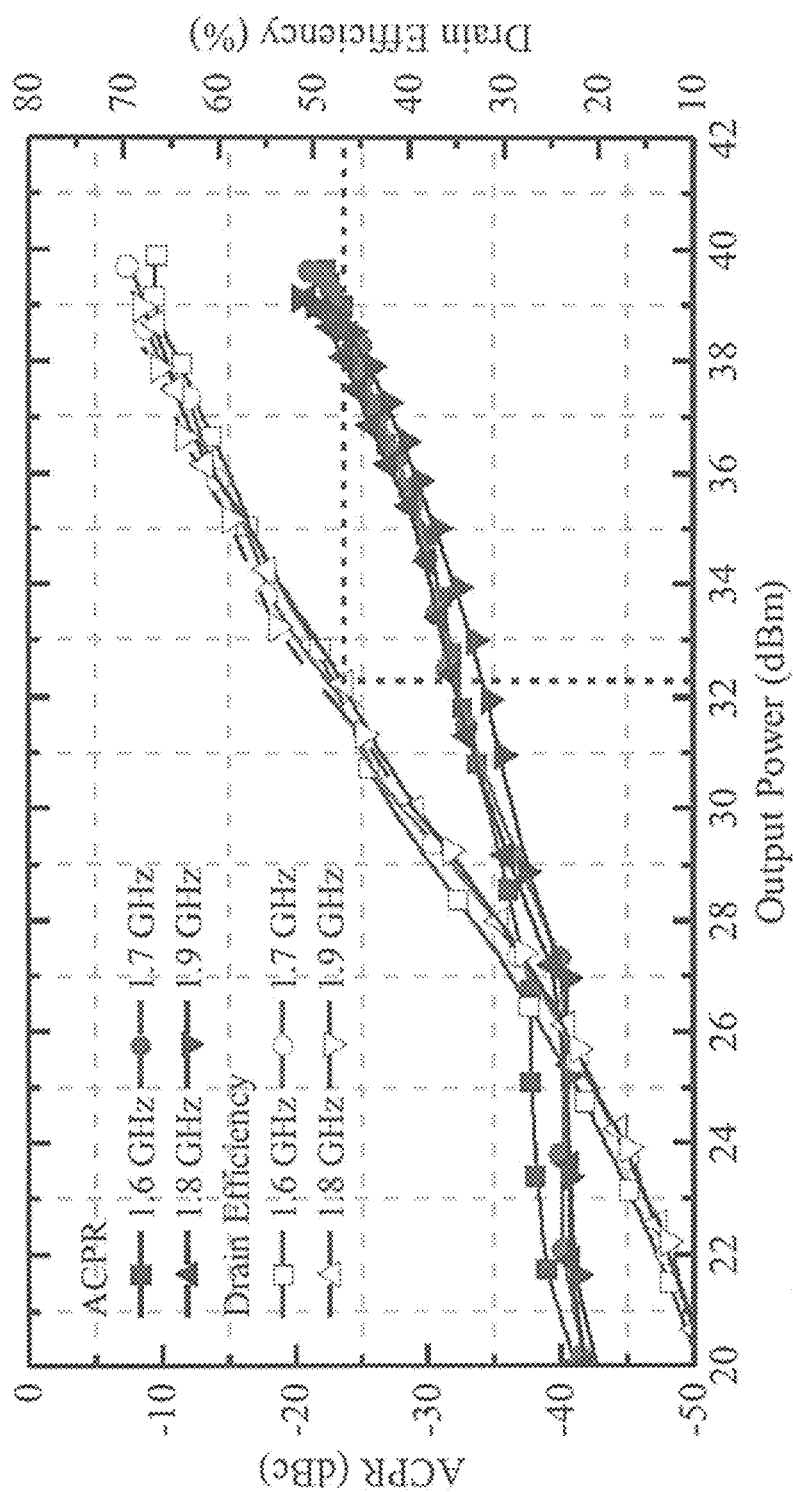
FIG. 31 is a graph showing measured adjacent channel power ratio (ACPR) (lower) and average modulated efficiency at different output power within entire operating frequency of the DPA configuration of FIG. 17.

To test the linearity of the DPA of the present embodiment, measurements were done using a WCDMA test signal with PAPR of 9.6 dB. Adjacent channel power ratio (ACPR) was measured with a channel integration bandwidth 3.84 MHz at 5 MHz offset using the Agilent CXA Signal Analyzer N9000A. As the ACPRs in both upper and lower bands are similar, only one of them (lower) is shown in FIG. 31. ACPR performance of the DPA of the present embodiment was better than −32 dBc at back off and −20 dBc at saturation from 1.6 to 1.9 GHz. The average efficiency is shown in FIG. 31. The average DE at 32.2 dBm (10-dB back-off point of CW measurement) is better than 46.5%, which is the same as results obtained with CW excitation. Average DE at 40 dBm (saturation) is better than 66%, which is similar to that obtained under CW excitation.

Figure 32:
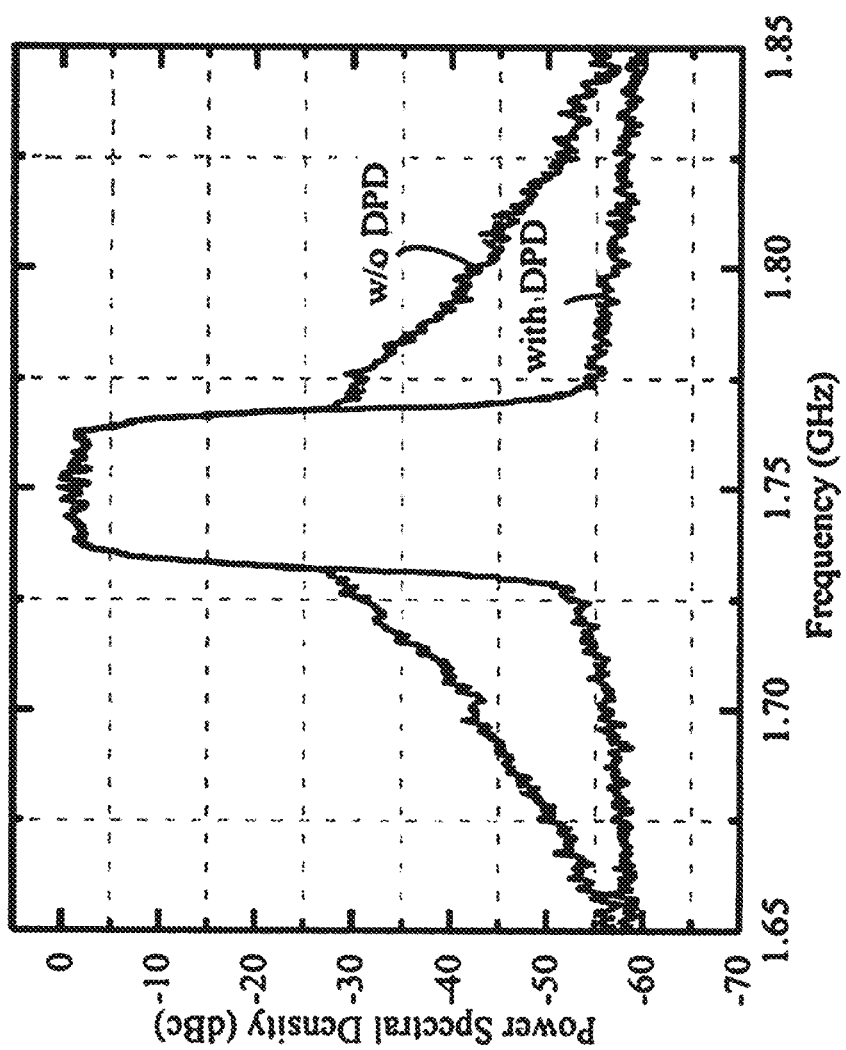
FIG. 32 is a graph showing the normalized power spectrum density of the DPA of FIG. 17 (1.75 GHz with an average output power of 32.2 dBm) with and without using digital pre-distortion (DPD).

FIG. 32 shows the power spectral density of the DPA of the present embodiment at a center frequency of 1.75 GHz. The DPA of the present embodiment amplifier was linearized by using digital pre-distortion (DPD) technique based on the dynamic deviation reduction Volterra series as presented in A. Zhu, J. C. Pedro, and T. J. Brazil, *"Dynamic deviation reduction based Volterra behavioral modeling of RF power amplifiers,"* IEEE Trans. Microw. Theory Techn., vol. 54, no. 12, pp. 4323-4332, December 2006. In particular, the static nonlinearity order is set to 9, kernel order is setting to 3 with memory depth of 5, and dynamic nonlinearity order set to 1. For the test, the linearization is done at back-off output power (32.2 dBm). After linearization, the DPA gave better than −53.3 dBc at back off, which is an improvement of at least 21.3 dB.

The DPA of the above embodiments exhibit a wide back-off range. It can be observed that 46% efficiency at 10-dB back off can be achieved over 1.6-1.9 GHz with the DPA of the present embodiment. Furthermore, the DPA of the present embodiment has a high saturated efficiency. The DPA of the present embodiment also exhibits a strong ACPR performance at 10-dB back-off irrespective of the DPD technique applied. Overall, the DPA of the present embodiment exhibits a good combined performance in terms of back-off range, power utilization factor and ACPR performance no matter what DPD technique is used.

The above embodiments of the invention provide a DPA, in particular a asymmetrical drain biased post-matching DPA, based on the self-generated harmonic injection. By integrating an HIN between the carrier and peaking branch, the self-generated second harmonic can be injected into the drain of the other device. Waveform amplitude modulation can be achieved in both carrier and peaking devices, which results in the enhancement of saturated power for both carrier and peaking devices, while the carrier back-off power remains unchanged. Consequently, the higher value of $\beta_d$ (power ratio between the carrier saturated output power and carrier back-off power) can be achieved while maintaining the same α (saturated power ratio between the peaking and carrier device). This results in an extended back-off range (10 dB), higher power utilization factor, and higher saturated efficiency for the DPA of the present embodiment. Embodiment of the DPA of the invention can provide extended Doherty range, enhancement in power utilization factor, and improved saturated efficiency, which are suitable for use in wireless communication system. In the above embodiments, the increased power ratio between the back-off and saturation of the carrier device is mainly due to the fact that effective dual harmonic injection occurs only after the back-off point; the unchanged power ratio between the main and auxiliary ("carrier and peaking") device at saturation is primarily due to enhancement in power in each of the main and auxiliary devices with the dual harmonic injection technique.

Embodiments of the invention provide various advantages, such as:

1) The DPA of the above embodiments has a wide back-off region (up to 10 dB), which can satisfy the peak power to average ratios requirement for most of standard modulated signals in wireless communication systems.
2) Due to waveform amplitude modulation as a result of the dual harmonic injection technique, the saturated output power of the DPA of the above embodiments is increased.
3) Due to waveform amplitude modulation as a result of the dual harmonic injection technique, the saturated efficiency of the DPA of the above embodiments is increased.
4) The principle and realization behind this back-off extension of the present invention is very simple yet efficient: the introduction of a harmonic injection network is practically realized by selecting a configuration with a high pass characteristic plus an offset line.
5) The technique provided in the above embodiments is also suitable for high power applications (such as 100 watts), which means that this technique is applicable for other high power industrial or commercial applications such as broadcasting.

It will be appreciated by persons skilled in the art that the term "network" or the like in the above can also be called a circuit or circuit part, which can be form by any combination of transmission line, transmission line portions, or other active or inactive electronic circuit components; the term "offset line" can also be called an "offset transmission line". Unless otherwise specified, the term "connected", "engaged", "coupled with/to", or the like, may refer to both direct and indirect connection, engagement, coupling, etc. The expression "Doherty power amplifier circuit" is used to refer to a "Doherty power amplifier" or any parts of it.

Numerous variations and/or modifications may be made to the invention as shown in the specific embodiments without departing from the spirit or scope of the invention as broadly described. The present embodiments are, therefore, to be considered, in all respects, illustrative and not restrictive. For example, the form and dimension of the Doherty power amplifier circuit may vary for different applications. The input side network, biasing network, load modulation network, and post-matching network illustrated in FIG. 1 can be of other form and construction, for different applications. The Doherty power amplifier circuit is preferably of asymmetrical DPA configuration, but in some cases, it can be a symmetrical DPA or a multi-way DPA configuration. The harmonic injection circuit can be of any topology with high pass or band pass frequency response. The use of main and auxiliary power amplification devices can be of any type and for different power applications. The harmonic extracting circuit in the harmonic injection network can be of different constructions. For example, the bypass element need not be a single capacitor, but be constructed of other high pass element.

The invention claimed is:

1. A Doherty power amplifier circuit, comprising:
a main power amplification device;
an auxiliary power amplification device arranged in parallel with the main power amplification device; and
a load modulation circuit comprising a harmonic injection circuit connected with respective outputs of the main power amplification device and the auxiliary power amplification device,
wherein the harmonic injection circuit is arranged to transfer harmonic components generated at the main power amplification device to the auxiliary power amplification device and harmonic components generated at the auxiliary power amplification device to the main power amplification device, when both the main and auxiliary power amplification devices are operating, for modulating the respective outputs of the main power amplification device and the auxiliary power amplification device;
wherein the harmonic injection circuit comprises:
a harmonic extraction circuit for selectively enabling transfer of the harmonic component through the harmonic injection circuit; and
an offset transmission line for affecting the phase of the harmonic component during the transfer.

2. The Doherty power amplifier circuit of claim 1, wherein the main power amplification device and the auxiliary power amplification device are the only power amplification devices in the Doherty power amplifier circuit.

3. The Doherty power amplifier circuit of claim 1, wherein the harmonic components generated at the main power amplification device comprises second-harmonic components.

4. The Doherty power amplifier circuit of claim 3, wherein the second-harmonic components generated at the main power amplification device only flow into the harmonic injection circuit.

5. The Doherty power amplifier circuit of claim 1, wherein the harmonic components generated at the auxiliary power amplification device comprises second-harmonic components.

6. The Doherty power amplifier circuit of claim 5, wherein the second-harmonic components generated at the auxiliary power amplification device only flow into the harmonic injection circuit.

7. The Doherty power amplifier circuit of claim 1, wherein the harmonic injection circuit is arranged to provide a 180° phase shift for the second-harmonic components.

8. The Doherty power amplifier circuit of claim 1, wherein the harmonic extraction circuit comprises:
a first transmission line;
a second transmission line arranged in series with the first transmission line;
a coupling transmission line arranged between the first and second transmission lines; and
a bypass element arranged to selectively enable direct transfer of harmonic components between the first and second transmission lines.

9. The Doherty power amplifier circuit of claim 8, wherein a central long axis of the first transmission line and a central long axis of the second transmission line are collinear.

10. The Doherty power amplifier circuit of claim 8, wherein the first transmission line, the second transmission line, the coupling transmission line, and the offset transmission line form a continuous transmission line.

11. The Doherty power amplifier circuit of claim 8, wherein the first transmission line, the second transmission line, the coupling transmission line, and the offset transmission line have the same width.

12. The Doherty power amplifier circuit of claim 8, wherein the coupling transmission line is grounded.

13. The Doherty power amplifier circuit of claim 8, wherein the coupling transmission line comprises:
a first portion arranged to extend perpendicular to the first transmission line;
a second portion arranged to extend perpendicular to the second transmission line; and
a third portion arranged to connect the first and second portions.

14. The Doherty power amplifier circuit of claim 13, wherein the first portion is parallel to the second portion.

15. The Doherty power amplifier circuit of claim 13, wherein the third portion is grounded.

16. The Doherty power amplifier circuit of claim 8, wherein the bypass element comprises a capacitor.

17. The Doherty power amplifier circuit of claim 7, wherein the offset transmission line of the harmonic injection circuit is arranged to introduce a 1800 phase shift for the second-harmonic components.

18. The Doherty power amplifier circuit of claim 1, wherein the load modulation circuit further comprises:
a first fundamental impedance inverter with an input connected with the output of the main power amplification device and the harmonic injection circuit, and an output;
a second fundamental impedance inverter with an input connected with the output of the auxiliary power amplification device and the harmonic injection circuit, and an output; and
an offset transmission line connected between the output of the first fundamental impedance inverter and the output of the second fundamental impedance inverter, the offset transmission line is arranged to compensate for a phase difference between fundamental components generated at the main power amplification device and fundamental components generated at the auxiliary power amplification device.

19. The Doherty power amplifier circuit of claim 18, wherein the first and second fundamental impedance inverters each form an LC-tank-equivalent circuit.

20. The Doherty power amplifier circuit of claim 1, wherein the Doherty power amplifier circuit is an asymmetrically Doherty power amplifier circuit in which the auxiliary power amplification device has a higher power capability than the main power amplification device.

21. The Doherty power amplifier circuit of claim 1, wherein the main power amplification device comprises a transistor biased to operate in Class AB mode.

22. The Doherty power amplifier circuit of claim 1, wherein the auxiliary power amplification device comprises a transistor biased to operate in Class C mode.

23. An electronic device comprising the Doherty power amplifier circuit of claim 1.

24. An electronic system comprising the Doherty power amplifier circuit of claim 1.

25. The Doherty power amplifier circuit of claim 3, wherein the harmonic injection circuit is arranged to provide a 180° phase shift for the second-harmonic components.

* * * * *